United States Patent
Jansen et al.

(10) Patent No.: US 10,637,473 B2
(45) Date of Patent: Apr. 28, 2020

(54) HIGH VOLTAGE TOLERANT CMOS DRIVER FOR LOW-VOLTAGE BI-DIRECTIONAL COMMUNICATION BUSES

(71) Applicant: European Space Agency, Paris (FR)

(72) Inventors: Richard Jansen, Oegstgeest (NL); Scott Lindner, Zurich (CH)

(73) Assignee: EUROPEAN SPACE AGENCY, Paris (FR)

( * ) Notice: Subject to any disclaimer, the term of this patent is extended or adjusted under 35 U.S.C. 154(b) by 155 days.

(21) Appl. No.: 15/737,437

(22) PCT Filed: Jun. 18, 2015

(86) PCT No.: PCT/EP2015/063761
§ 371 (c)(1),
(2) Date: Dec. 18, 2017

(87) PCT Pub. No.: WO2016/202395
PCT Pub. Date: Dec. 22, 2016

(65) Prior Publication Data
US 2018/0175859 A1    Jun. 21, 2018

(51) Int. Cl.
*H03B 1/00* (2006.01)
*H03K 3/00* (2006.01)
(Continued)

(52) U.S. Cl.
CPC ... *H03K 19/00338* (2013.01); *G06F 13/4022* (2013.01); *H03K 19/00315* (2013.01); *H03K 19/018507* (2013.01)

(58) Field of Classification Search
CPC ..... H03K 19/00338; H03K 19/018507; H03K 19/00315; G06F 13/4022
(Continued)

(56) References Cited

U.S. PATENT DOCUMENTS 5,646,809 A    7/1997 Motley et al.
2002/0041194 A1    4/2002 Onizawa et al.

FOREIGN PATENT DOCUMENTS

WO    9429961 A1    12/1994
WO    WO-9429961 A1 * 12/1994 ......... H03K 17/0822

OTHER PUBLICATIONS

International Search Report and Written Opinion for related PCT application No. PCT/EP2015/063761 dated Feb. 24, 2016.

* cited by examiner

*Primary Examiner* — Metasebia T Retebo
(74) *Attorney, Agent, or Firm* — Procopio, Cory, Hargreaves & Savitch LLP

(57) ABSTRACT

A bi-state driver circuit for switching an output terminal between a first predetermined voltage level and a high impedance state, which involves a first string of transistors connected between the output terminal and the first predetermined voltage level at least a first transistor arranged closer to the first predetermined voltage level, a second transistor arranged closer to the output terminal, a voltage divider circuit connected between the output terminal and a voltage level of a control signal attaining voltage levels between the first predetermined voltage level and a second predetermined voltage level, including at least one intermediate node having an intermediate voltage level between a voltage level of the output terminal and the voltage level of the control signal, and a second string of transistors connected between the intermediate node of the voltage divider circuit and the second predetermined voltage level, and including at least a third transistor.

15 Claims, 18 Drawing Sheets

(51) Int. Cl.
    *H03K 19/003* (2006.01)
    *G06F 13/40* (2006.01)
    *H03K 19/0185* (2006.01)
(58) Field of Classification Search
    USPC .......................................................... 327/108
    See application file for complete search history.

HIGH VOLTAGE TOLERANT CMOS DRIVER FOR LOW-VOLTAGE BI-DIRECTIONAL COMMUNICATION BUSES

CROSS-REFERENCE TO RELATED APPLICATIONS

This application is a U.S. National Stage entry of PCT Application No. PCT/EP2015/063761, filed on Jun. 18, 2015, the entire contents of which are hereby incorporated by reference.

TECHNICAL FIELD

This application relates to bi-state driver circuits and tri-state driver circuits and to methods of operating such bi-state driver circuits and tri-state driver circuits. The application particularly relates to bi-state driver circuits and tri-state driver circuits for use in high voltage tolerant communication bus drivers, such as CMOS drivers for bi-directional communication buses.

BACKGROUND

For bi-directional communication buses, both the driver and receiver have to accommodate not only the supply voltage variation of each of the drivers attached to the communication bus, but also any possible ground bounce between the drivers. The latter may be especially the case if the drivers reside in different electrical units. This implies that even for the case of the voltage levels of the generated bus signals lying between a supply voltage level and ground, the voltage on the communication bus could vary by a multiple of the supply voltage. For the particular case of the Controller Area Network (CAN) standard, the generated H and L bus line voltages lie between 0.5V and 4.5V, while the sensed signals reach from −2V to +7V and resilience of the drivers to signal voltages from −3V to +16V is required.

The small required voltage range of the applied bus line signals for the CAN transceiver would make the CAN transceiver an ideal candidate for implementation on a low-voltage digital CMOS process. Unfortunately, presently available low-voltage Complementary Metal-Oxide-Semiconductor (CMOS) integrated circuit architectures fail to cope with the large possible voltages on the CAN bus. Consequently, conventional CAN transceivers are manufactured in special high-voltage CMOS or bipolar processes.

While radiation hard low-voltage (e.g. 3.3V) digital CMOS processes are available, the presently available accommodated voltage range for these radiation-hard digital CMOS processes is limited and non-compliant even to the minimum required CAN bus voltage levels (i.e. from −2V to +7V). Thus, conventional CAN drivers cannot be realized using such low-voltage digital CMOS processes, simply because the gate-drain voltage in forward bias would be too large for the transistors involved in this type of CMOS processes. Accordingly, conventional CAN driver implementations use high voltage transistors and protection diodes.

On the other hand, presently available high-voltage CMOS processes, which would allow for the implementation of CAN standard compliant transceivers, are not radiation tolerant.

Thus, there is a need for a radiation-hard driver structure for a bi-directional communication bus (e.g. a CAN bus) that may be implemented in a low-voltage digital CMOS process. There is a further need for radiation-hard tri-state driver circuits and bi-state driver circuits for a bi-directional communication bus (e.g. a CAN bus) that may be implemented in a low-voltage digital CMOS process.

SUMMARY

In view of this need, the present document proposes a bi-state driver circuit and a method of controlling a bi-state driver circuit, having the features of the respective independent claims. The present document further proposes driver circuits comprising the bi-state driver circuit having the features of the respective independent claims.

An aspect of the disclosure relates to a bi-state driver circuit for switching an output terminal (output pad) between a first predetermined voltage level (first state) and a high impedance state (second state). The bi-state driver circuit may comprise a first string of transistors connected between the output terminal and the first predetermined voltage level and comprising at least a first transistor arranged closer to the first predetermined voltage level and a second transistor arranged closer to the output terminal. The bi-state driver circuit may further comprise a voltage divider circuit connected between the output terminal and a voltage level of a control signal attaining voltage levels between the first predetermined voltage level and a second predetermined voltage level. The voltage divider circuit may comprise at least one intermediate node having an intermediate voltage level between a voltage level of the output terminal and the voltage level of the control signal. The voltage divider circuit may comprise one or more strings of resistors. For example, the voltage divider circuit may comprises a first part, which is a string of resistors, and a second part, which comprises two or more strings of resistors connected in parallel. The bi-state driver circuit may further comprise a second string of transistors connected between the intermediate node of the voltage divider circuit and the second predetermined voltage level, and comprising at least a third transistor. A control terminal (e.g. gate terminal) of the second transistor may be connected to the intermediate node of the voltage divider circuit. The first transistor may be configured to be switched (driven) in accordance with the control signal, e.g. a control terminal (e.g. gate terminal) of the first transistor may be connected to the voltage level of the control signal. The third transistor may be configured to be switched (driven) in accordance with the control signal, in a phase-locked relationship with the first transistor (i.e. with a fixed phase with respect to the first transistor, e.g. in phase or in anti-phase with the switching of the first transistor, or with any other fixed phase $\Delta\varphi$, $0<\Delta\varphi\leq2\pi$ with respect to the first transistor). For example, a control terminal (e.g. gate terminal) of the third transistor may be connected to a voltage level obtained by inverting the control signal (which would exemplarily result in the third transistor switching substantially in phase with the first transistor). The inverted control signal may be said to correspond to the complement of the control signal. In the above and in the remainder of the disclosure, a string of elements is understood to relate to a series connection of these elements.

The first and second predetermined voltage levels may be a supply voltage and ground, respectively, or vice versa. Accordingly, the bi-state driver circuit may be a pull-up circuit or a pull-down circuit, depending on the choice of the first and second predetermined voltage levels. The first to third transistors may be FETs, such as MOSFETs. For instance, if the first predetermined voltage level is ground and the second predetermined voltage level is the supply voltage, the first transistor and the second transistor may be NMOS transistors and the third transistor may be a PMOS transistor. Conversely, if the first predetermined voltage level is the supply voltage and the second predetermined voltage level is ground, the first transistor and the second transistor may be PMOS transistors and the third transistor may be a NMOS transistor. An additional voltage divider circuit may be arranged between the output terminal and the voltage level obtained by inverting the voltage level of the control signal, e.g. by mirroring the voltage level of the control signal with respect to a middle voltage (mid-point voltage) between the first and second predetermined voltage levels.

During operation of the bi-state driver circuit, a case may occur in which the voltage level at the output terminal (that may be applied to the output terminal by a line of a communication bus) becomes higher than the higher one of the first and second predetermined voltage levels or lower than the lower one of the first and second predetermined voltage levels. Configured as above, the voltage level at the control terminal (e.g. gate terminal) of each transistor of the first string is allowed to float with the voltage level at the main terminal of the respective transistor that is arranged towards the output terminal (e.g. drain terminal), thereby avoiding an overvoltage between the control terminal and said main terminal. More specifically, the voltage difference between the voltage level at the output terminal and the voltage level of the control signal is split by the voltage divider circuit, and a gate-drain voltage at each of the first and second transistors can be kept below a critical value even for transistors created in a low-voltage CMOS process. Likewise, gate-source and gate-well/bulk voltages can be kept below respective critical values. The first transistor may be switched directly by the control signal. Since the control terminal of the second transistor is connected to the intermediate node of the voltage divider circuit, and the intermediate node of the voltage divider circuit is connected to the second predetermined voltage level via the third transistor (i.e. via the second string), which is switched in said phase-locked relationship with the first transistor, the second transistor may be reliably and stably switched, with short settling time, regardless of a voltage level at the output terminal. More specifically, by providing the aforementioned configuration, a case is avoided in which, after initial switching of the first and second transistors to the on state, the second transistor would be switched off again due to the voltage level of the output terminal approaching the first predetermined voltage level. Accordingly, the present invention addresses the issue of high-voltage compliance of a bi-state driver circuit implemented in a radiation-tolerant low-voltage digital CMOS process. Using such bi-state driver circuit, for the first time a radiation tolerant CAN transceiver resilient to the high bus line voltages can be realized in a low-voltage CMOS process. Further, by appropriately combining two bi-state driver circuits, connected to the same output terminal and connected between the first and second predetermined voltage levels in an inverse relationship to each other, a radiation tolerant tri-state driver circuit that may be implemented in a low-voltage CMOS process is obtained.

In embodiments, the second string may further comprise a fourth transistor connected between the third transistor and the intermediate node of the voltage divider circuit. If the third transistor is a PMOS, also the fourth transistor may be a PMOS, and if the third transistor is an NMOS, also the fourth transistor may be an NMOS. The bi-state driver circuit may further comprise a fifth transistor connected between the first predetermined voltage level and a control terminal (e.g. gate terminal) of the fourth transistor. If the third transistor is a PMOS, the fifth transistor may be an NMOS, and if the third transistor is an NMOS, the fifth transistor may be a PMOS. The fifth transistor may be configured to be switched (driven) in accordance with the control signal, in a phase-locked relationship with the first transistor, e.g. in phase with the first transistor. By this configuration, the voltage across terminals of each of the transistors in the second string may be reduced. Thereby, resilience of the bi-state driver circuit with respect to high voltages can be further increased.

In embodiments, the bi-state driver circuit may further comprise a sixth transistor connected between the fifth transistor and the control terminal of the fourth transistor. A control terminal of the sixth transistor may be connected to the intermediate node of the voltage divider circuit. Accordingly, the voltage across terminals of the fifth transistor is reduced. Thereby, resilience of the bi-state driver circuit with respect to high voltages can be further increased. Further, an additional (positive) feedback loop is provided by the above configuration, which contributes to a further reduction of the settling time when switching the bi-state driver circuit. On the other hand, the above positive switching properties of the bi-state driver circuit are retained.

In embodiments, the first string of transistors may comprise (at least) N transistors, where $N \geq 2$. The first string may comprise more than the N transistors. The N transistors in the first string may include the first transistor and the second transistor. The voltage divider circuit may comprise (at least) $N-1$ intermediate nodes having intermediate voltage levels between the voltage level of the output terminal and a voltage level of a control signal attaining voltage levels between the first predetermined voltage level and a second predetermined voltage level. Control terminals of $N-1$ transistors of the N transistors of the first string that are arranged closest to the output terminal may be connected, in the order of their arrangement in the first string from the output terminal towards the first predetermined voltage level, to respective intermediate nodes of the voltage divider circuit, in the order of their intermediate voltage levels, from the voltage level of the output terminal to the voltage level of the control signal. The bi-state driver circuit may comprise $N-1$ second strings of transistors. Each m-th second string among the $N-1$ second strings, where $1 \leq m \leq N-1$, may comprise (at least) m transistors and may be connected between the second predetermined voltage level and that intermediate node to which the control terminal of the (m+1)-th transistor among the N transistors in the first string, counting from the first predetermined voltage level, is connected. Each m-th second string may comprise more than the m transistors. The second string comprising the third transistor may be among the $N-1$ second strings. A transistor among the N transistors in the first string that is arranged closest to the first predetermined voltage level may be configured to be switched (driven) in accordance with the control signal. In each of the $N-1$ second strings, a transistor arranged closest to the second predetermined voltage level may be configured to be switched (driven) in accordance with the control signal, in a phase-locked relationship with said transistor of the first string arranged closest to the first predetermined voltage level, e.g. in phase with said transistor of the first string arranged closest to the first predetermined voltage level.

In embodiments, a bi-state driver circuit for switching an output terminal between a first predetermined voltage level (first state) and a high impedance state (second state) may thus be provided. The bi-state driver circuit may comprise a first string of transistors connected between the output terminal and the first predetermined voltage level and comprising (at least) N transistors, where N≥2. The bi-state driver circuit may further comprise a voltage divider circuit connected between the output terminal and the first predetermined voltage level and comprising (at least) N−1 intermediate nodes having respective intermediate voltage levels between a voltage level of the output terminal and the first predetermined voltage level. The voltage divider circuit may comprise one or more strings of resistors. For example, the voltage divider circuit may comprises a first part, which is a string of resistors, and a second part, which comprises two or more strings of resistors connected in parallel. Control terminals of N−1 transistors among the N transistors in the first string that are arranged closest to the output terminal may be connected, in the order of their arrangement in the first string from the output terminal towards the first predetermined voltage level, to respective intermediate nodes of the voltage divider circuit, in the order of their intermediate voltage levels, from the voltage level of the output terminal to the voltage level of the control signal. The bi-state driver circuit may further comprise N−1 second strings of transistors. Each m-th second string among the N−1 second strings, where 1≤m N−1, may comprise (at least) m transistors and may be connected between a second predetermined voltage level and the control terminal of the (m+1)-th transistor, counting from the first predetermined voltage level, among the N transistors in the first string. A transistor among the N transistors in the first string that is arranged closest to the first predetermined voltage level may be configured to be switched (driven) in accordance with a control signal attaining voltage levels between the first predetermined voltage level and the second predetermined voltage level, e.g. a control terminal (e.g. gate terminal) of this transistor may be connected to the voltage level of the control signal. In each of the N−1 second strings, a transistor arranged closest to the second predetermined voltage level may be configured to be switched (driven) in accordance with the control signal, in a phase-locked relationship with the transistor among the N transistors in the first string arranged closest to the first predetermined voltage level, e.g. in phase with the transistor among the N transistors in the first string arranged closest to the first predetermined voltage level. For example, a control terminal (e.g. gate terminal) of this transistor may be connected to a voltage level obtained by inverting the control signal.

The first and second predetermined voltage levels may be a supply voltage and ground, respectively, or vice versa. Accordingly, the bi-state driver circuit may be a pull-down circuit or a pull-up circuit, depending on the choice of the first and second predetermined voltage levels. The transistors of the first and second strings of transistors may be FETs, such as MOSFETs. For instance, if the first predetermined voltage level is ground and the second predetermined voltage level is the supply voltage, the transistors of the first string may be NMOS transistors and the transistors of the second strings may be PMOS transistors. Conversely, if the first predetermined voltage level is the supply voltage and the second predetermined voltage level is ground, the transistors of the first string may be PMOS transistors and the transistors of the second strings may be NMOS transistors. An additional voltage divider circuit may be connected between the output terminal and a voltage level obtained by inverting the voltage level of the control signal, e.g. by mirroring the voltage level of the control signal with respect to a middle voltage (mid-point voltage) between the first and second predetermined voltage levels. The additional voltage divider circuit may comprise (at least) N−2 intermediate nodes having intermediate voltage levels between the voltage level of the output terminal and the voltage level obtained by inverting the voltage level of the control signal. For each m-th second string, 1≤m≤N−1, control terminals of the m−1 transistors that are arranged farthest from the second predetermined voltage level may be connected, in the order of their arrangement in the m-th second string from the second predetermined voltage level towards the output terminal, to respective intermediate nodes of the additional voltage divider circuit, in the order of their intermediate voltage levels, from the voltage level obtained by inverting the voltage level of the control signal to the voltage level of the output terminal.

In embodiments, N may be equal to or greater than 3, i.e. N≥3. The bi-state driver circuit may further comprise N−2 third strings of transistors. Each n-th third string, where 1≤n≤N−2, may comprise (at least) n transistors and may be connected between the first predetermined voltage level and respective control terminals of (n+1)-th transistors, counting from the second predetermined voltage level, of each of the (n+1)-th to (N−1)-th second strings. In each third string, a transistor arranged closest to the first predetermined voltage level may be configured to be switched (driven) in accordance with the control signal, in a phase-locked relationship with said transistor among the N transistors in the first string arranged closest to the first predetermined voltage level, e.g. in phase with said transistor among the N transistors in the first string arranged closest to the first predetermined voltage level. For example, control terminals (e.g. gate terminals) of these transistors may be connected to the voltage level of the control signal. The transistors of the third strings may be of the same type (e.g. PMOS or NMOS) as the transistors of the first string.

Providing a greater number of intermediate nodes of the voltage divider circuit and a greater number of transistors in the first string connected between the output terminal and the first predetermined voltage level (e.g. ground or the supply voltage) further reduces the voltage across the terminals of each transistor of the first string, e.g. the gate-drain voltages at each of these transistors. Accordingly, resilience of the bi-state driver circuit to high voltages can be further improved. By further providing the second and third strings of transistors, stable and reliable switching of the transistors of the first string can be ensured, as well as a short settling time of the bi-state driver circuit. This stable and reliable switching is achieved regardless of an external voltage (line voltage) applied to the output terminal.

In embodiments, for each n-th third string, control terminals of the n−1 transistors different from said transistor arranged closest to the first predetermined voltage level may be connected to respective intermediate nodes of the voltage divider circuit. For example, for each n-th third string, the control terminals of the second to n-th transistors, counting from the first predetermined voltage level, may be respectively connected to those intermediate nodes of the voltage divider circuit to which the second to n-th transistors among the N transistors in the first string, counting from the first predetermined voltage level, are connected.

In embodiments, each n-th third string may comprise (at least) n+1 transistors. For each n-th third string, a control terminal of the (n+1)-th transistor, counting from the first predetermined voltage level, may be connected to the control terminal of the (n+1)-th transistor, counting from the first predetermined voltage level, among the N transistors in the first string.

Accordingly, the voltage across terminals of each of the transistors in the third strings may be reduced. Thereby, resilience of the bi-state driver circuit with respect to high voltages can be further increased. On the other hand, the above positive switching properties of the bi-state driver circuit are retained.

In embodiments, each m-th second string may comprise (at least) m+1 transistors. For each p-th second string, where $1 \leq p \leq N-2$, a control terminal of the (p+1)-th transistor, counting from the second predetermined voltage level, may be connected to the control terminal of the (p+1)-th transistor of the (p+1)-th second string, counting from the second predetermined voltage level. The bi-state driver circuit may further comprise an additional third string of transistors (i.e. an (N−1)-th third string of transistors) comprising (at least) N−1 transistors and being connected between the first predetermined voltage level and a control terminal of the N-th transistor, counting from the second predetermined voltage level, of the (N−1)-th second string. The transistors of the additional third string may be of the same type (e.g. PMOS or NMOS) as the transistors of the first string. A transistor of the additional third string arranged closest to the first predetermined voltage level may be configured to be switched (driven) in accordance with the control signal, in a phase-locked relationship with said transistor among the N transistors in the first string arranged closest to the first predetermined voltage level, e.g. in phase with said transistor among the N transistors in the first string arranged closest to the first predetermined voltage level. For example, a control terminal (e.g. gate terminal) of this transistor may be connected to the voltage level of the control signal.

Accordingly, the voltage across terminals of each of the transistors in the second strings may be reduced. Thereby, resilience of the bi-state driver circuit with respect to high voltages can be further increased. Further, an additional (positive) feedback loop is provided by the above configuration, which contributes to a further reduction of the settling time when switching the bi-state driver circuit. On the other hand, the above positive switching properties of the bi-state driver circuit are retained.

In embodiments, in the additional third string, control terminals of the N−2 transistors different from said transistor arranged closest to the first predetermined voltage level may be connected to respective intermediate nodes of the voltage divider circuit. For example, in the additional third string, the control terminals of the second to (N−1)-th transistors, counting from the first predetermined voltage level, may be respectively connected to those intermediate nodes of the voltage divider circuit to which the second to (N−1)-th transistors, counting from the first predetermined voltage level, of the first string are connected.

In embodiments, the voltage divider circuit may comprise a string of resistors. The string of resistors may comprise N resistors. The intermediate nodes of the voltage divider circuit may be arranged between adjacent resistors. Configured as above, the voltage divider circuit can be implemented in a simple and cost-effective manner.

In embodiments, the voltage divider circuit may comprise a main string of resistors connected between the output terminal and the voltage level of the control signal. A first group of intermediate nodes may be formed by intermediate nodes respectively arranged between adjacent resistors of the main string of resistors. The control terminals of the N transistors in the first string of transistors may be connected to respective intermediate nodes in the first group. The voltage divider circuit may further comprise one or more secondary strings of resistors, each secondary string of resistors being connected between one of the intermediate nodes of the first group and the voltage level of the control signal. A second group of intermediate nodes may be formed by intermediate nodes respectively arranged between adjacent resistors of the one or more secondary strings of resistors. The control terminal of at least one of the transistors of one of the third strings may be connected to an intermediate node in the second group. Thereby, additional flexibility and isolation in switching the transistors of the third strings can be provided for.

In embodiments, for at least one of the N transistors in the first string of transistors, a series-connected transistor may be provided. The respective transistor and the series-connected transistor may be connected in series, e.g. a source terminal of one of the respective transistor and the series-connected transistor may be connected to a drain terminal of the other one of the respective transistor and the series-connected transistor. A control terminal of the series-connected transistor may be connected to the control terminal of the respective transistor. Bulk terminals of the respective transistor and the series connected transistor may be connected to an intermediate node arranged between the respective transistor and the series-connected transistor, e.g. the bulk terminal of the respective transistor and the bulk terminal of the series-connected transistor may be connected to an intermediate node between said source terminal and said drain terminal. Thereby, reverse leakage currents across the transistors of the first string can be effectively prevented and high-voltage resilience of the bi-state driver circuit is further improved.

Another aspect of the disclosure relates to a driver circuit for switching a first output terminal between a first output voltage level (first state) and a high impedance state (second state), and for switching a second output terminal between a second output voltage level (third state) and a high impedance state (fourth state). The driver circuit may comprise a first bi-state driver circuit according to the preceding aspect for switching the first output terminal between said first output voltage level and said high impedance state. The driver circuit may further comprise a second bi-state driver circuit according to the preceding aspect for switching the second output terminal between said second output voltage level and said high impedance state. The first and second output terminals may be switched synchronously to the first and second output voltage levels, respectively, and may be switched synchronously to the high impedance state. The second bi-state driver circuit may be connected in reverse polarity between the first and second predetermined voltage levels compared to the first bi-state driver circuit. The first predetermined voltage level of the first bi-state driver may correspond to the first output voltage level, the second predetermined voltage level of the first bi-state driver circuit may correspond to the second output voltage level, and the output terminal of the first bi-state driver circuit may correspond to the first output terminal of the driver circuit. Further, the first predetermined voltage level of the second bi-state driver may correspond to the second output voltage level, the second predetermined voltage level of the second bi-state driver circuit may correspond to the first output voltage level, and the output terminal of the second bi-state driver circuit may correspond to the second output terminal of the driver circuit.

In other words, the first string of the first bi-state driver circuit may be connected between the first output terminal and the first output voltage level, and the second string of the first bi-state driver circuit may be connected between the intermediate node of the voltage divider circuit of the first bi-state driver circuit and the second output voltage level. Further, the first string of the second bi-state driver circuit may be connected between the second output terminal and the second output voltage level, and the second string of the second bi-state driver circuit may be connected between the intermediate node of the voltage divider circuit of the second bi-state driver circuit and the first output voltage level.

Another aspect of the disclosure relates to a driver circuit for switching a first output terminal between a first output voltage level (first state) and a high impedance state (second state), and for switching a second output terminal between a second output voltage level (third state) and a high impedance state (fourth state). The driver circuit may comprise a first bi-state driver circuit according to the aforementioned aspects for switching the first output terminal between said first output voltage level and said high impedance state. The driver circuit may further comprise a second bi-state driver circuit according to the aforementioned aspects for switching the second output terminal between said second output voltage level and said high impedance state. The first and second output terminals may be switched synchronously to the first and second output voltage levels, respectively, and may be switched synchronously to the high impedance state. The second bi-state driver circuit may be connected in reverse polarity between the first and second output voltage levels compared to the first bi-state driver circuit. Thus, the first predetermined voltage level of the first bi-state driver may correspond to the first output voltage level, the second predetermined voltage level of the first bi-state driver circuit may correspond to the second output voltage level, and the output terminal of the first bi-state driver circuit may correspond to the first output terminal of the driver circuit. Further, the first predetermined voltage level of the second bi-state driver may correspond to the second output voltage level, the second predetermined voltage level of the second bi-state driver circuit may correspond to the first output voltage level, and the output terminal of the second bi-state driver circuit may correspond to the second output terminal of the driver circuit. At least one transistor may be shared between the first bi-state driver circuit and the second bi-state driver circuit. For example, the first to (N−2)-th third strings of the second bi-state driver circuit may be implemented by the first to (N−2)-th second strings of the first bi-state driver circuit, and vice versa.

By the above configurations, a radiation hard driver circuit resilient to high voltages can be provided, that may be implemented in a low-voltage CMOS process (i.e. that includes low-voltage transistors). This driver circuit may be employed e.g. in the context of a bi-directional (differential) communication bus, such as a CAN bus, for example.

Another aspect of the disclosure relates to a method of controlling a bi-state driver circuit for switching an output terminal between a first predetermined voltage level (first state) and a high impedance state (second state). The bi-state driver circuit may comprise a first string of transistors connected between the output terminal and the first predetermined voltage level and comprising at least a first transistor arranged closer to the first predetermined voltage level and a second transistor arranged closer to the output terminal. The bi-state driver circuit may further comprise a voltage divider circuit connected between the output terminal and a voltage level of a control signal, comprising at least one intermediate node having an intermediate voltage level between a voltage level of the output terminal and the first predetermined voltage level. The intermediate node may be connected to a control terminal (e.g. gate terminal) of the second transistor. The bi-state driver circuit may further comprise a second string of transistors connected between the intermediate node of the voltage divider circuit and a second predetermined voltage level, and comprising at least a third transistor. The method may comprise generating the control signal attaining voltage levels between the first predetermined voltage level and the second predetermined voltage level. The method may further comprise switching (driving) the first transistor in accordance with the control signal. The method may yet further comprise switching (driving) the third transistor in accordance with the control signal, in a phase-locked relationship with the first transistor, e.g. in phase with the first transistor.

Another aspect of the disclosure relates to a method of controlling a bi-state driver circuit for switching an output terminal between a first predetermined voltage level (first state) and a high impedance state (second state). The bi-state driver circuit may comprise a first string of transistors connected between the output terminal and the first predetermined voltage level and comprising (at least) N transistors, where N≥2. The bi-state driver circuit may further comprise a voltage divider circuit connected between the output terminal and a voltage level of a control signal attaining voltage levels between the first predetermined voltage level and a second predetermined voltage level, and comprising (at least) N−1 intermediate nodes having respective intermediate voltage levels between a voltage level of the output terminal and the voltage level of the control signal. The voltage divider circuit may comprise one or more strings of resistors. For example, the voltage divider circuit may comprises a first part, which is a string of resistors, and a second part, which comprises two or more strings of resistors connected in parallel. Control terminals of N−1 transistors among the N transistors in the first string that are arranged closest to the output terminal may be connected, in the order of their arrangement in the first string from the output terminal towards the first predetermined voltage level, to respective intermediate nodes of the voltage divider circuit, in the order of their intermediate voltage levels, from the voltage level of the output terminal to the voltage level of the control signal. The bi-state driver circuit may further comprise N−1 second strings of transistors. Each m-th second string among the N−1 second strings, where 1≤m≤N−1, may comprise (at least) m transistors and may be connected between a second predetermined voltage level and the control terminal of the (m+1)-th transistor, counting from the first predetermined voltage level, among the N transistors in the first string. The method may comprise generating the control signal attaining voltage levels between the first predetermined voltage level and the second predetermined voltage level. The method may further comprise switching (driving) a transistor among the N transistors in the first string that is arranged closest to the first predetermined voltage level in accordance with the control signal. The method may yet further comprise switching (driving), in each of the N−1 second strings, a transistor arranged closest to the second predetermined voltage level in accordance with the control signal, in a phase-locked relationship with said transistor among the N transistors in the first string that is arranged closest to the first predetermined voltage level, e.g. in phase with said transistor among the N transistors in the first string that is arranged closest to the first predetermined voltage level.

In embodiments, N may be equal to or greater than 3, i.e. N≥3. The bi-state driver circuit may further comprise N−2 third strings of transistors. Each n-th third string, where 1≤n≤N−2, may comprise (at least) n transistors and may be connected between the first predetermined voltage level and respective control terminals of (n+1)-th transistors, counting from the second predetermined voltage level, of each of the (n+1)-th to (N−1)-th second strings. The transistors of the third strings may be of the same type (e.g. PMOS or NMOS) as the transistors of the first string. The method may further comprise, in each third string, switching (driving) a transistor that is arranged closest to the first predetermined voltage level in accordance with the control signal, in a phase-locked relationship with said transistor among the N transistors in the first string that is arranged closest to the first predetermined voltage level, e.g. in phase with said transistor among the N transistors in the first string that is arranged closest to the first predetermined voltage level.

It is noted that the method according to the preceding aspects may be applied to or used in the context of the bi-state driver circuits or driver circuits according to any of the preceding aspects.

It will be appreciated that method steps and apparatus features may be interchanged in many ways. In particular, the details of the disclosed apparatus can be implemented as a method, and vice versa, as the skilled person will appreciate.

BRIEF DESCRIPTION OF THE FIGURES

Embodiments of the disclosure are explained below in an exemplary manner with reference to the accompanying drawings, wherein FIG. 1 schematically illustrates a pull-down circuit as an example of a bi-state driver circuit according to embodiments of the disclosure, FIG. 2 schematically illustrates another pull-down circuit as an example of a bi-state driver circuit according to embodiments of the disclosure, FIG. 3 schematically illustrates another pull-down circuit as an example of a bi-state driver circuit according to embodiments of the disclosure, FIG. 4 schematically illustrates an example of a variation of the pull-down circuit illustrated in FIG. 3, FIG. 5 schematically illustrates a pull-up circuit as an example of a bi-state driver circuit according to embodiments of the disclosure, FIG. 6 schematically illustrates another pull-up circuit as an example of a bi-state driver circuit according to embodiments of the disclosure, FIG. 7 schematically illustrates an example of a variation of the pull-down circuit illustrated in FIG. 1, FIG. 8 schematically illustrates another example of a variation of the pull-down circuit illustrated in FIG. 1, FIG. 9 schematically illustrates an example of a variation of the pull-down circuit illustrated in FIG. 2, FIG. 10 schematically illustrates another example of a variation of the pull-down circuit illustrated in FIG. 2, FIG. 11 schematically illustrates another example of a variation of the pull-down circuit illustrated in FIG. 2, FIG. 12 schematically illustrates an example of a driver circuit according to embodiments of the disclosure, FIG. 13 schematically illustrates another example of a driver circuit according to embodiments of the disclosure, FIG. 14A and FIG. 14B schematically illustrate an example of a paired transistor unit for use in bi-state driver circuits according to embodiments of the disclosure.

DETAILED DESCRIPTION

In the following, the invention will be described in an exemplary manner with reference to the appended figures. Identical elements in the figures may be indicated by identical reference numbers, and repeated description thereof may be omitted.

Throughout the present disclosure, it is understood that a bi-state driver circuit may relate to either a pull-up circuit or a pull-down circuit. The bi-state driver circuit may be either active or inactive. In the active state (dominant state), the line voltage (i.e. the voltage at the output terminal) is pulled towards a predetermined voltage level, e.g. the supply voltage or ground.

In the inactive state (recessive state), the line voltage goes towards the equivalent line voltage, i.e. the bi-state driver circuit presents a high impedance to the line.

Figure 1:
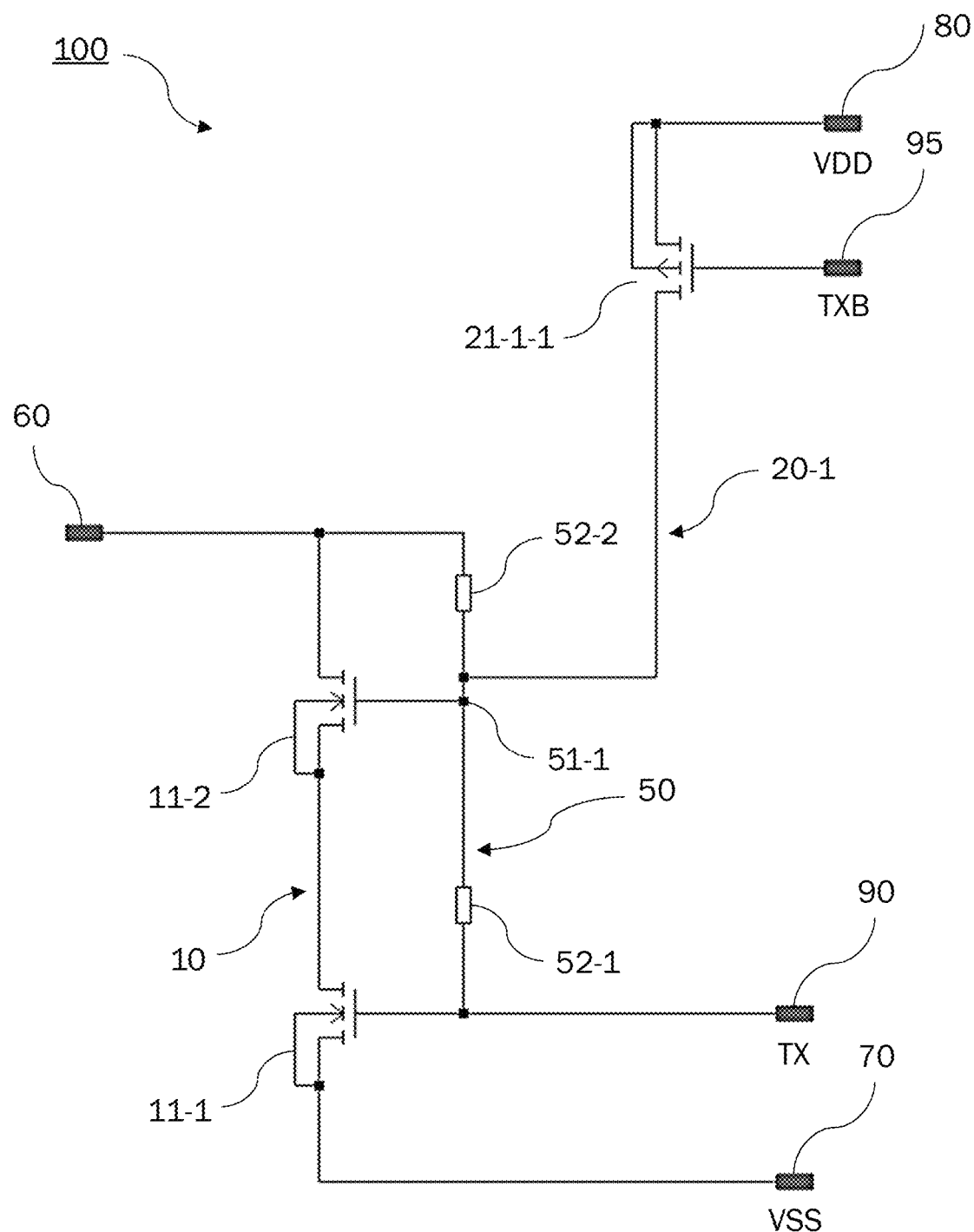

FIG. 1 schematically illustrates a pull-down circuit as an example of a bi-state driver circuit 100 according to embodiments of the disclosure.

Figure 5:
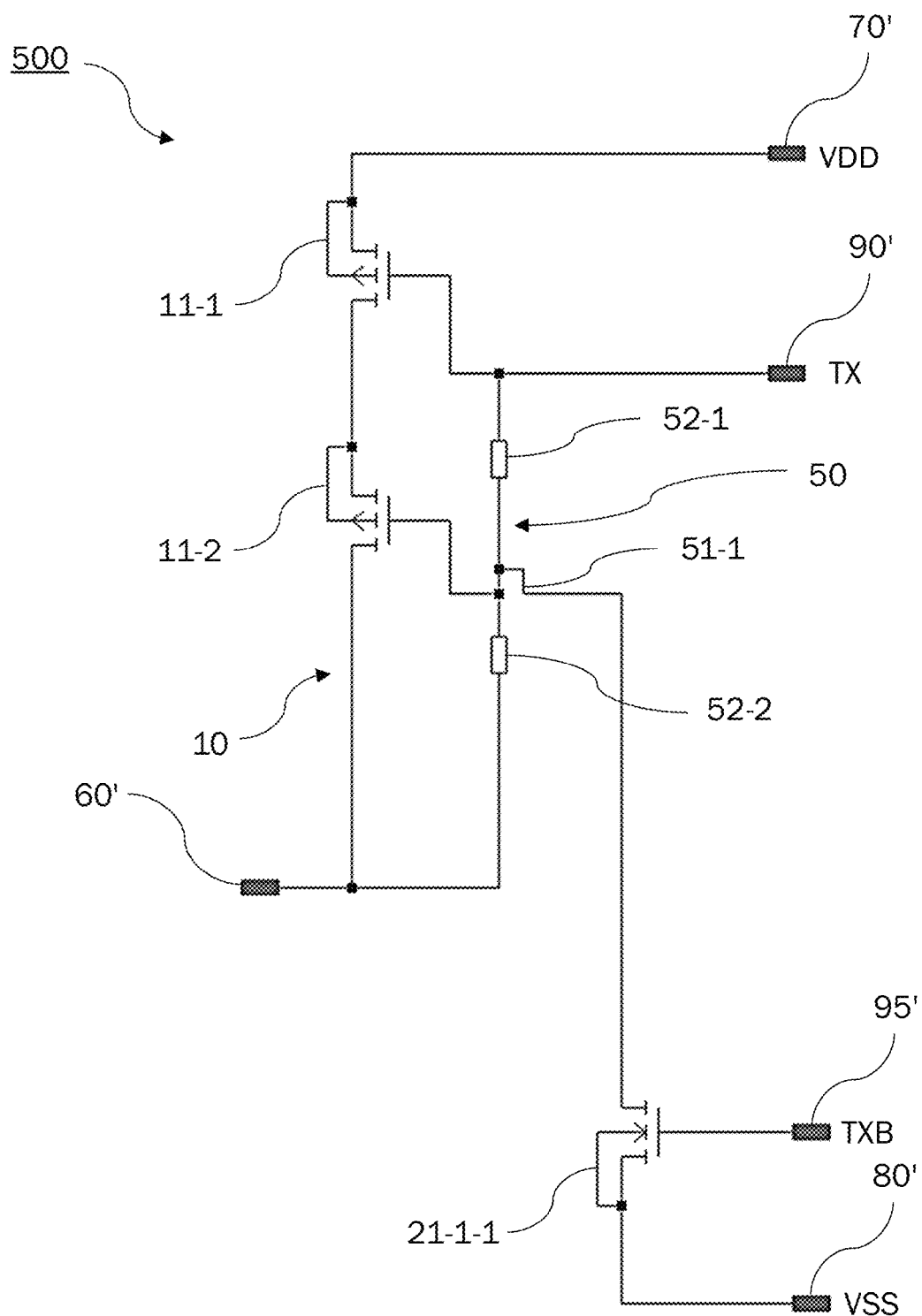

The bi-state driver circuit 100 comprises an output terminal 60, a first predetermined voltage level 70, a second predetermined voltage level 80, a voltage level 90 of a control signal (TX), and a voltage level 95 of an inverted version of the control signal (TXB). The control signal may attain voltage levels between the first predetermined voltage level 70 and the second predetermined voltage level 80. For example, the control signal may alternatingly attain the first predetermined voltage level 70 and the second predetermined voltage level 80. In the example of FIG. 1, the first predetermined voltage level 70 corresponds to ground (VSS), and the second predetermined voltage level 80 corresponds to a (e.g. positive) supply voltage (VDD). Hence, the bi-state driver circuit 100 corresponds to a pull-down circuit, i.e. may be used for switching the output terminal between the first predetermined voltage level (i.e. ground in the present example; first state) and a high impedance state (second state). The high impedance state may be a state in which an externally applied voltage level is attained by the output terminal. An example of a bi-state driver circuit 500 corresponding to a pull-up circuit, i.e. which is connected between the first predetermined voltage level 70 and the second predetermined voltage level 80 in inverse polarity compared to the bi-state driver circuit 100 of FIG. 1 is illustrated in FIG. 5 and will be described in more detail below. The inverted version of the control signal may be obtained by mirroring the control signal with respect to a mid-point voltage between the first predetermined voltage level 70 and second predetermined voltage level 80. To perform the inversion, the bi-state driver circuit 100 may comprise an inverter (not shown in the figure). The inverted version of the control signal may correspond to the complement of the control signal.

Figure 4:
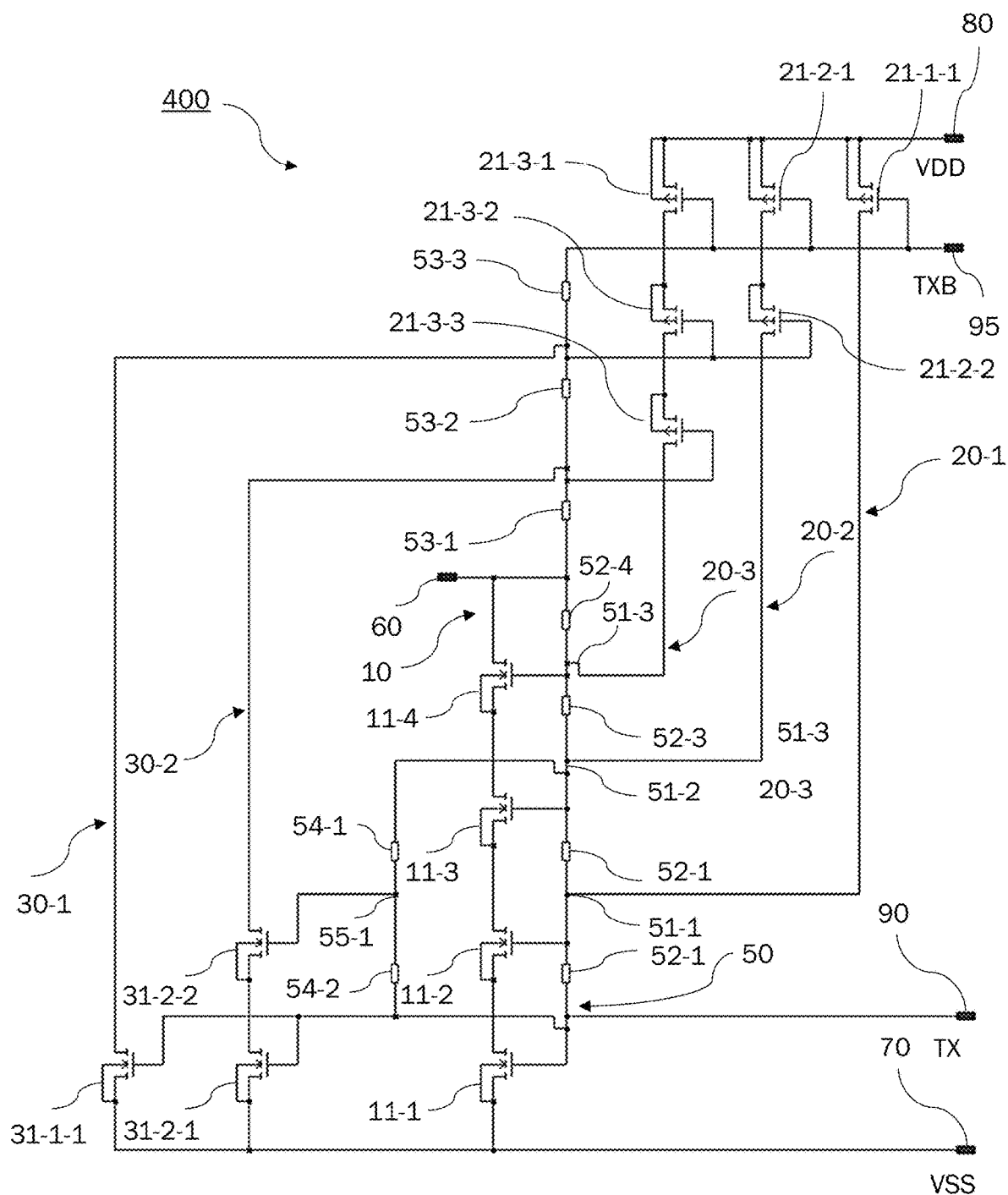

The bi-state driver circuit 100 further comprises a voltage divider circuit 50 connected between the output terminal 60 and the voltage level 90 of the control signal. The voltage divider circuit 50 comprises at least one intermediate node 51-1 (that may be commonly referred to as intermediate nodes 51 unless a distinction is required) having a voltage level between the voltage level of the output terminal 60 and the voltage level 90 of the control signal. The voltage divider circuit 50 may be implemented by a string (i.e. series connection) of resistors 52-1, 52-2 (that may be commonly referred to as resistors 52 unless a distinction is required). In this case, the intermediate nodes 51 may be respectively arranged between adjacent resistors 52. A further exemplary implementation of the voltage divider circuit 50 is illustrated in FIG. 4 and will be described in more detail below.

The bi-state driver circuit 100 further comprises a first string (i.e. series connection) 10 of transistors 11-1, 11-2 (that may be commonly referred to as transistors 11 unless a distinction is required). The first string 10 is connected between the output terminal 60 and the first predetermined voltage level 70. A control terminal (e.g. gate terminal) of the transistor 11-1 of the first string 10 arranged closest to the first predetermined voltage level 70 (i.e. the bottom transistor in the present example) is connected to the voltage level 90 of the control signal, i.e. this transistor is switched (driven) in accordance with the control signal. Further, a control terminal (e.g. gate terminal) of the transistor 11-2 of the first string 10 arranged closest to the output terminal 60 (i.e. the top transistor in the present example) is connected to the intermediate node 51-1 of the voltage divider circuit 50.

The bi-state driver circuit 100 further comprises a second string (i.e. series connection) 20-1 of transistors 21-1-1 (that may be commonly referred to as transistors 21-1 unless a distinction is required) comprising at least one transistor 21-1-1. A control terminal of the transistor 21-1-1 in the second string that is arranged closest to the second predetermined voltage level 80 (i.e. the top transistor in the present example) is connected to the voltage level 95 obtained by inverting the control signal. This transistor may be said to be switched (driven) in accordance with the control signal, in a phase-locked relationship with the first transistor 11-1, e.g. in phase with the first transistor 11-1. The control signal may be inverted by mirroring the control signal with respect to a mid-point voltage between the first predetermined voltage level 70 and second predetermined voltage level 80.

In the case of (at least) two transistors in the first string 10 illustrated in the figure, the first string 10 may be said to comprise a first transistor 11-1 arranged closer to the first predetermined voltage level 70 and a second transistor 11-2 arranged closer to the output terminal 60. Further, the second string 20-1 may be said to comprise a third transistor 20-1-1.

Next, a switching operation of the bi-state driver circuit 100 illustrated in FIG. 1 will be described. Assume that the bi-state driver circuit 100 is in the recessive state, i.e. the output terminal 60 is in the high impedance state (i.e. the bi-state driver circuit 100 presents a high impedance to the line connected to the output terminal). By appropriately raising the voltage level 90 of the control signal above ground (exemplarily embodying the first predetermined voltage level 70), i.e. by offsetting the voltage level 90 of the control signal from the first predetermined voltage level 70 towards the second predetermined voltage level 80 (e.g. up to the second predetermined voltage level 80), the first transistor 11-1 of the first string 10 is switched to the (fully) conducting state. At the same time, the third transistor 21-1-1 is switched to the (fully) conducting state. Accordingly, the voltage level at the gate terminal of the second transistor 11-2 is raised to the supply voltage (exemplarily embodying the second predetermined voltage level 80) and the voltage level at the source terminal of the second transistor is lowered towards ground. Thereby, the second transistor 11-2 can be stably switched to the (fully) conducting state regardless of a voltage level at the output terminal 60, i.e. even for voltage levels at the output terminal 60 lying outside of the voltage range bounded by the first predetermined voltage level 70 and the second predetermined voltage level 80. Further, excessive gate-drain voltages at the first and second transistors 11-1, 11-2 are prevented. By switching each of the first and second transistors 11-1, 11-2 to the (fully) conducting state, the output terminal 60 is switched to the first predetermined voltage level 70 (i.e. ground in the present example).

Figure 7:
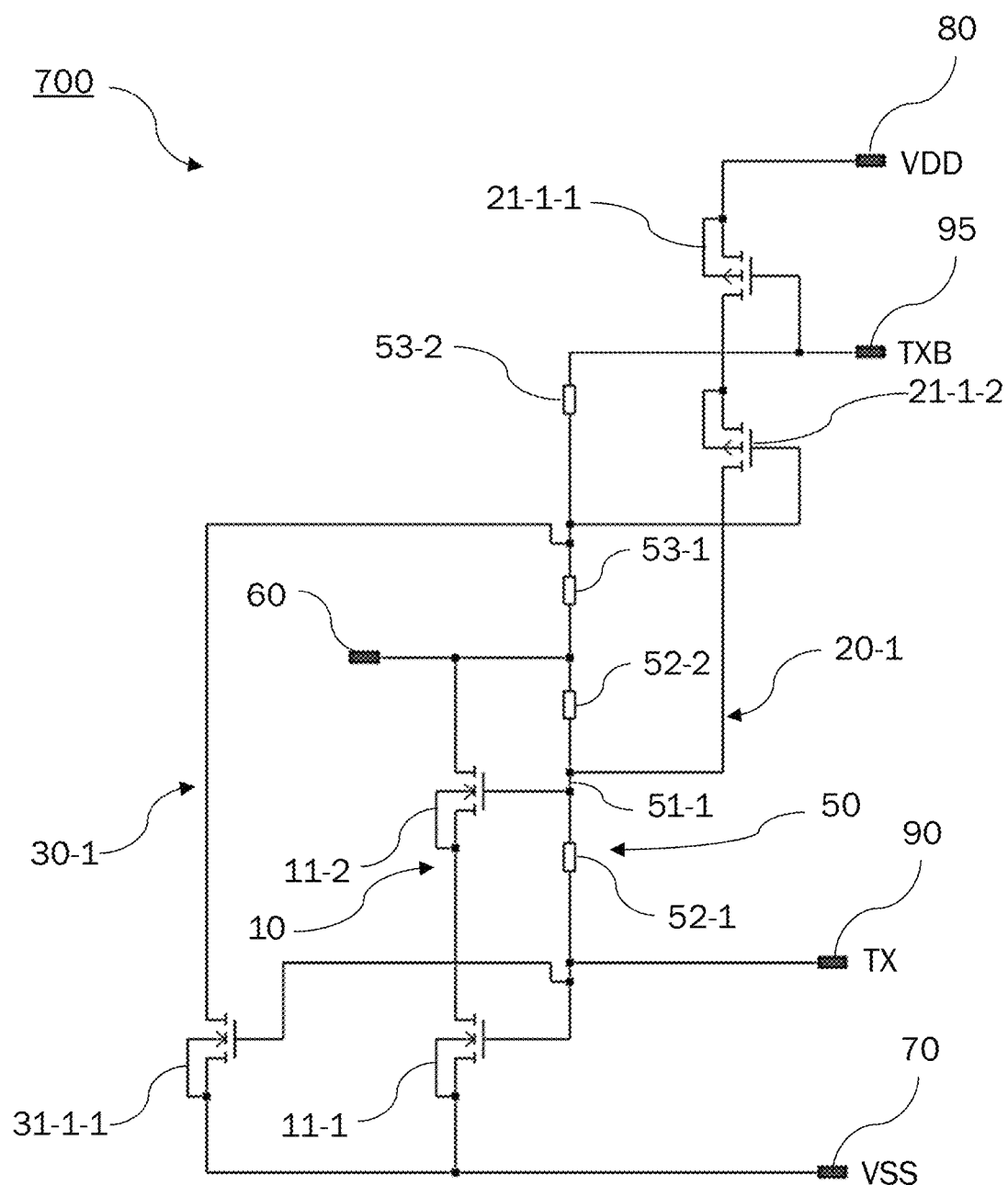

FIG. 7 schematically illustrates an example of a variation of the bi-state driver circuit 100 illustrated in FIG. 1. Only differences with respect to the bi-state driver circuit 100 of FIG. 1 will be described. In addition to the elements described above, the bi-state driver circuit 700 illustrated in this figure comprises a fourth transistor 21-1-2 in the second string of transistors (i.e. the second string comprises the third transistor 21-1-1 and the fourth transistor 21-1-2), and a fifth transistor 31-1-1 (e.g. arranged in a third string of transistors 30-1) connected between the first predetermined voltage level 70 and a control terminal (e.g. gate terminal) of the fourth transistor 21-1-2. The bi-state driver circuit 700 may further comprise an additional voltage divider circuit comprising resistances (e.g. resistors 53-1, 53-2) connected between the output terminal 60 and the voltage level 95 obtained by inverting the control signal, e.g. by mirroring the voltage level 90 of the control signal with respect to a mid-point voltage between the first and second predetermined voltage levels 70, 80. In other words, the additional voltage divider circuit may be connected between the output terminal 60 and the control terminal of the third transistor 21-1-1.

Providing the fourth transistor 21-1-2 results in a reduction of the voltage drop across the terminals (especially the gate-drain voltage) of the third transistor 21-1-1, and therefore further increases the high-voltage resilience of the bi-state driver circuit 700. Providing the fifth transistor 31-1-1 ensures appropriate switching of the fourth transistor 21-1-2.

Figure 8:
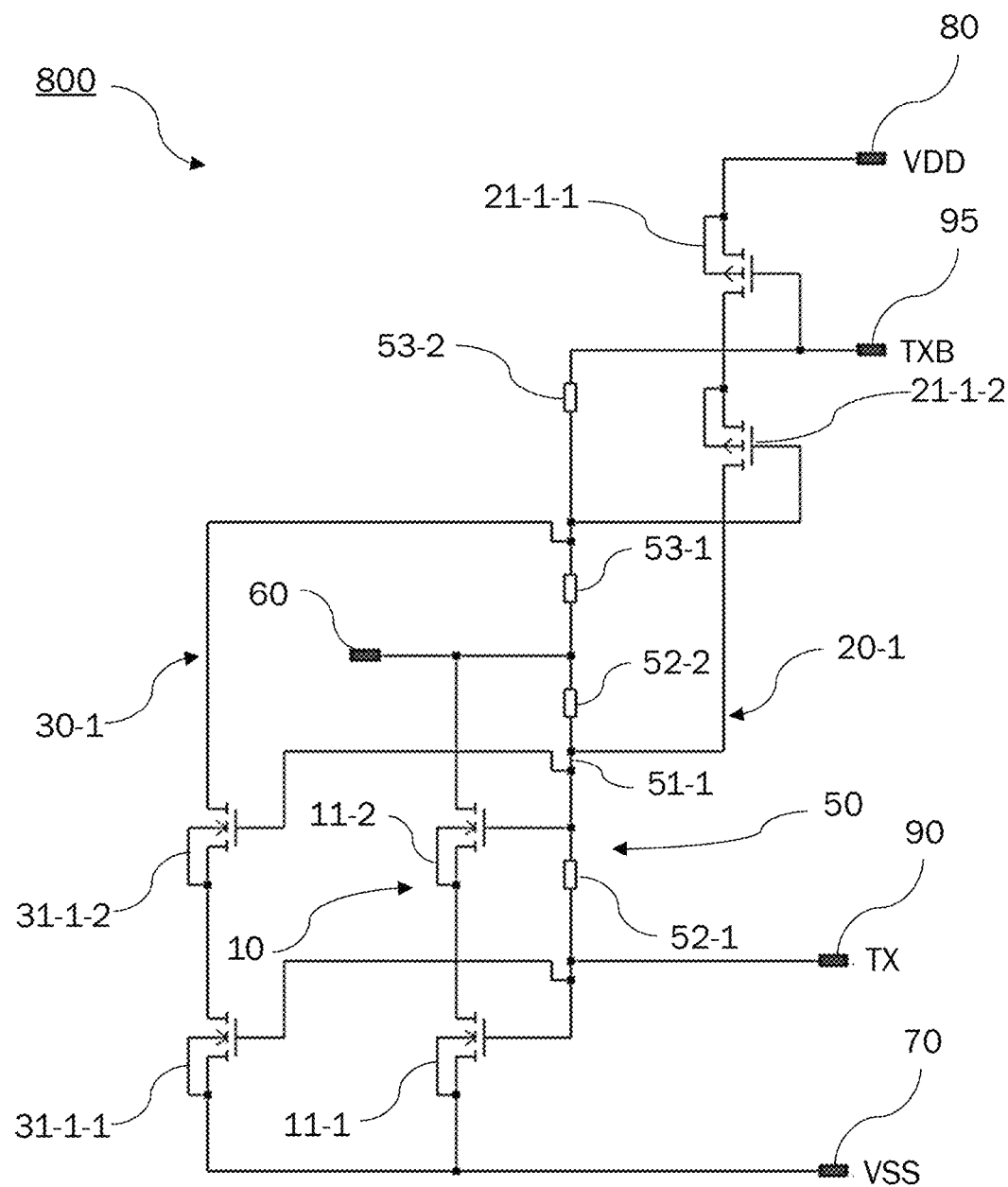

FIG. 8 schematically illustrates another example of a variation of the bi-state driver circuit 100 illustrated in FIG. 1. Only differences with respect to the bi-state driver circuit 700 of FIG. 7 will be described. In addition to the elements described above, the bi-state driver circuit 800 illustrated in this figure comprises a sixth transistor 31-1-2 (e.g. arranged in a third string of transistors 30-1 together with the fifth transistor 31-1-1) connected between the fifth transistor 31-1-1 and the control terminal of the fourth transistor 21-1-2. A control terminal of the sixth transistor 31-1-2 is connected to the intermediate node 51-1.

Providing the sixth transistor 31-1-2 results in a reduction of the voltage drop across the terminals (especially the gate-drain voltage) of the fifth transistor 31-1-2 and therefore further increases the high-voltage resilience of the bi-state driver circuit 800.

Moreover, a positive feedback loop including the fifth transistor 31-1-1 and sixth transistor 31-1-2 is provided which aids to reduce a settling time of the bi-state driver circuit 800 upon switching.

As can be seen e.g. from FIG. 7 and FIG. 8, the third string may in principle comprise a greater number of transistors than the third string illustrated in FIG. 5. For example, the third string may comprise transistors up to the number of transistors 11 in the first string 10. Control terminals of the additional transistors in the third string may have connections to the (intermediate nodes of the) voltage divider circuit 50 in accordance to that of corresponding transistors 11 of the first string 10. In other words, the second and further transistors in the third string, counting from the first predetermined voltage level, may be connected, in the order of their arrangement in the third string from the first predetermined voltage level towards the output terminal, to respective intermediate nodes of the voltage divider circuit 50, in the order of their intermediate voltage levels, from the voltage level of the control signal to the voltage level of the output terminal.

FIG. 5 schematically illustrates a pull-up circuit as an example of a bi-state driver circuit 500 according to embodiments of the disclosure. The bi-state driver circuit 500 illustrated in FIG. 5 corresponds to the bi-state driver circuit 100 illustrated in FIG. 1, with the difference that the first predetermined voltage level 70' now corresponds to the (positive) supply voltage (VDD), and that the second predetermined voltage level 80' now corresponds to ground (VSS). Hence, the bi-state driver circuit 500 in this figure corresponds to a pull-up circuit, i.e. may be used for switching the output terminal 60' between the first predetermined voltage level (i.e. the supply voltage in the present example; first state) and a high impedance state (second state).

Notably, also pull-up circuits corresponding to the variations illustrated in FIG. 7 and FIG. 8 may be obtained by inverting (flipping) respective assignments of the supply voltage and ground to the first predetermined voltage level and the second predetermined voltage level. In other words, a respective pull-up circuit may be obtained from any of the pull-down circuits described above by interchanging the roles of the first and second predetermined voltage levels, and vice versa. Pull-up circuits and pull-down circuits may thus be said to be complementary, with functions of their respective PMOS and NMOS transistors interchanged.

It is to be noted that FIG. 1, FIG. 5, FIG. 7, and FIG. 8 illustrate the particular case of a bi-state driver circuit having (at least) N=2 transistors 11 in the first string 10. In general, the first string 10 may comprise (at least) N transistors 11, where N≥2. In this case, control terminals (e.g. gate terminals) of the transistors among the N transistors other than the transistor 11-1 among the N transistors that is arranged closest to the first predetermined voltage level 70, i.e. second to N-th transistors 11-2, . . . , 11-N among the N transistors are connected to respective intermediate nodes of the voltage divider circuit 50. For instance, the control terminals of these transistors 11-2, . . . , 11-N and the intermediate nodes 51 of the voltage divider circuit 50 may be in a one-to-one relationship (i.e. the voltage divider circuit 50 may comprise N−1 intermediate nodes), and the control terminals of these transistors 11-2, . . . , 11-N may be connected, in the order of their arrangement from the first predetermined voltage level 70 to the output terminal 60, to respective intermediate nodes 51-1, . . . , 51-[N−1] of the voltage divider circuit 50, in the order of their arrangement from the voltage level 90 of the control signal to the output terminal 60. The bi-state driver circuit may comprise N−1 second strings, and each m-th second string 20-*m*, where m=1, . . . , N−1, comprises (at least) m transistors 21-*m*-1, . . . , 21-*m*-*m*. Each m-th second string 20-*m* is connected between the second predetermined voltage level 80 and that intermediate node 51-*m* of the voltage divider circuit 50 to which the control terminal of the (m+1)-th transistor 11-[m+1] among the N transistors in the first string 10 (counting from the first predetermined voltage level 70) is connected.

In the general case of (at least) N transistors 11 in the first string 10, the bi-state driver circuit may further comprise N−2 third strings of transistors 30-1, . . . , 30-[N−2]. Each n-th third string 30-*n*, where n=1, . . . , N−2, comprises (at least) n transistors 31-*n*-1, . . . , 31-*n*-*n*. Further, each n-th third string 30-*n* may be connected between the first predetermined voltage level 70 and respective control terminals of the (n+1)-th transistors (counting from the second predetermined voltage level 80) of each of the (n+1)-th to (N−1)-th second strings 20-[n+1], . . . , 20-[N−1]. In each third string, the transistor 31-*n*-1 arranged closest towards the first predetermined voltage level 70 may be switched in accordance with the control signal, in a phase-locked relationship with the transistor 11-1 among the N transistors in the first string 10 that is arranged closest towards the first predetermined voltage level 70, e.g. in phase with the transistor 11-1 among the N transistors in the first string 10 that is arranged closest towards the first predetermined voltage level 70. For example, control terminals of each of respective transistors arranged closest towards the first predetermined voltage level 70 in the third strings 30-1, . . . , 30-[N−2] and in the first string 10 may be connected to each other. Further, for each n-th third string, control terminals of the remaining transistors may be connected to respective intermediate nodes 51 of the voltage divider circuit 50. For example, for each n-th third string 30-*n*, the control terminals of the second to n-th transistors 31-*n*-2, . . . , 31-*n*-*n* (counting from the first predetermined voltage level 70) may be respectively connected to the second to n-th transistors 11-2, . . . , 11-*n* among the N transistors in the first string 10 (counting from the first predetermined voltage level 70). Providing the third strings contributes to stably switching (driving) the l-th transistor in each l-th second string 20-*l*, where l=2, . . . , N−1 (i.e. of the bottom transistors in the second to (N−1)-th second strings in the present example).

In the general case of (at least) N transistors 11 in the first string 10, the bi-state driver circuit may further comprise an additional voltage divider circuit arranged (connected) between the output terminal 60 and the voltage level 95 obtained by inverting the control signal. The additional voltage divider circuit may comprise intermediate nodes to which the control terminals of the transistors 21 of the second strings 20 are connected. For example, the additional voltage divider circuit may comprise (at least) N−2 intermediate nodes, and the second to l-th transistors of each l-th second string (counting from the second predetermined voltage level 80), where l=2, . . . , N−1, may be respectively connected to the first to (N−2)-th intermediate nodes of the additional voltage divider circuit (counting from the voltage level 95 obtained by inverting the control signal).

As becomes apparent from the above description, the first string 10 may comprise transistors 11 in excess of the number N. Here, the number N sets the dimensions (i.e. number of second and third strings, and minimum number of transistors in these strings) of a pre-driver for switching transistors of the first string 10. However, not all transistors 11 of the first string 10 require switching by the pre-driver. Accordingly, a number of transistors 11 in excess of N in the first string 10 are understood to be switched in a conventional manner, not relying on the pre-driver comprising the second and third strings. Notably, such transistors in excess of the number N might be inserted at any point between said N transistors in the first string 10, respectively (e.g. alternatingly with the N transistors in the first string 10, to mention only one example).

Notably, also the second and third strings may in principle comprise a greater number of transistors than the respective numbers stated above and in the remainder of the present disclosure. The stated numbers thus may be understood to represent minimum numbers. For example, any or each of the third strings may comprise up to N transistors. Likewise, any or each of the second strings may comprise up to N transistors. Control terminals of the additional transistors in the second and third strings may have connections to the (intermediate nodes of the) additional voltage divider circuit and the (intermediate nodes of the) voltage divider circuit 50, respectively, in accordance to those of the transistors in the (N−1)-th second string 20-[N−1] and the first string 10, respectively. For up to N transistors in a given third string, their control terminals may be connected, respectively, to the voltage level of the control signal and to respective ones of the N−1 intermediate nodes of the voltage divider circuit 50. In other words, control terminals of the first additional transistor and further transistors in a given third string, counting from the first predetermined voltage level, may be connected, in the order of their arrangement in the given third string from the first predetermined voltage level towards the output terminal, to respective intermediate nodes of the voltage divider circuit 50, in the order of their intermediate voltage levels, from the voltage level of the control signal to the voltage level of the output terminal. In general, the control terminals of respective q-th transistors, q=1, . . . , N, in the third strings may be connected to a common node, e.g. control terminals of respective first transistors in the third strings, counting from the first predetermined voltage level, may be connected to the voltage level of the control signal, and control terminals of respective N-th transistors in the third strings, counting from the first predetermined voltage level, may be connected to the same intermediate node of the voltage divider circuit 50 as the control terminal of the N-th transistor 11-N of the first string 10, counting from the first predetermined voltage level, and so forth. For up to N transistors in a given second string, their control terminals may be connected, respectively, to the voltage level obtained by inverting the voltage level of the control signal and to respective ones of the intermediate nodes of the additional voltage divider circuit (in this case, the additional voltage divider circuit may have at least N−1 intermediate nodes). In other words, control terminals of the first additional transistor and further transistors in a given second string, counting from the second predetermined voltage level, may be connected, in the order of their arrangement in the given second string from the second predetermined voltage level towards the output terminal, to respective intermediate nodes of the additional voltage divider circuit, in the order of their intermediate voltage levels, from the voltage level obtained by inverting the voltage level of the control signal to the voltage level of the output terminal. In general, the control terminals of respective r-th transistors, r=1, . . . , N, in the second strings may be connected to a common node, e.g. control terminals of respective first transistors in the second strings, counting from the second predetermined voltage level, may be connected to the voltage level obtained by inverting the voltage level of the control signal, and control terminals of respective N-th transistors in the second strings, counting from the second predetermined voltage level, may be connected to the additional (i.e. (N−1)-th) third string, and so forth.

Figure 2:
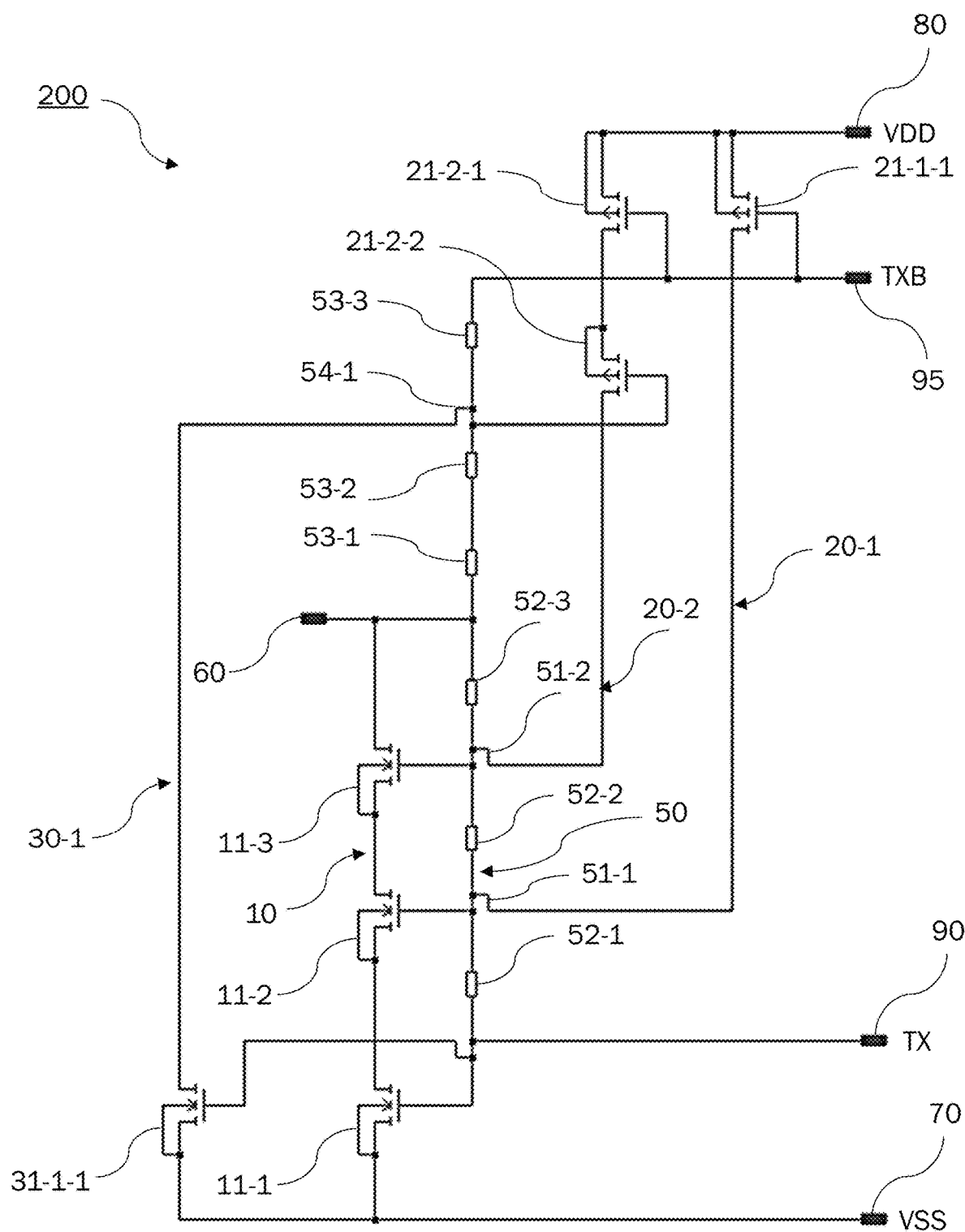

A pull-down circuit for the case of N=3 is shown in FIG. 2 as another example of a bi-state driver circuit 200 according to embodiments of the disclosure. Adapting the above general description to the case of N=3, it follows that the bi-state driver circuit 200 comprises a first string 10, two second strings 20-1, 20-2, and one third string 30-1. The first string 10 comprises three transistors 11-1, . . . , 11-3, a first one 20-1 of the second strings comprises a single transistor 21-1-1, the second one 20-2 of the second strings comprises two transistors 21-2-1, 21-2-2, and the third string 30-1 comprises a single transistor 31-1-1. The voltage divider circuit 50 comprises two intermediate nodes 51-1, 51-2, and the additional voltage divider circuit comprises a single intermediate node 54-1. The first transistor 11-1 of the first string 11 (counting from the first predetermined voltage level 70) is switched in accordance with the control signal, e.g. its control terminal is connected to the voltage level 90 of the control signal. The control terminal of the second transistor 11-2 of the first string 11 (counting from the first predetermined voltage level 70) is connected to the first intermediate node 51-1 of the voltage divider circuit 50 (counting from the voltage level 90 of the control signal). The control terminal of the third transistor 11-3 of the first string 10 (counting from the first predetermined voltage level 70) is connected to the second intermediate node 51-2 of the voltage divider circuit 50 (counting from the voltage level 90 of the control signal). The first one 20-1 of the second strings is connected between the second predetermined voltage level 80 and the first intermediate node 51-1 of the voltage divider circuit 50 (counting from the voltage level 90 of the control signal). The second one 20-2 of the second strings is connected between the second predetermined voltage level 80 and the second intermediate node 51-2 of the voltage divider circuit 50 (counting from the voltage level 90 of the control signal). The respective first transistors 21-1-1, 21-2-1 of the second strings 20-1, 20-2 are switched in accordance with the control signal, in a phase-locked relationship with the first transistor 11-1 of the first string 10, e.g. in phase with the first transistor 11-1 of the first string 10. For example, the control terminals of these transistors may be connected to the voltage level 95 obtained by inverting the control signal. A control terminal of the second transistor 21-2-2 (counting from the second predetermined voltage level 80) in the second one 20-2 of the second strings is connected to the intermediate node 54-1 of the additional voltage divider circuit. The third string 30-1 is connected between the first predetermined voltage level 70 and the control terminal of the second transistor 21-2-2 of the second one 20-2 of the second strings (i.e. between the first predetermined voltage level 70 and the intermediate node 54-1 of the additional voltage divider circuit.

Next, a switching operation of the bi-state driver circuit 200 illustrated in FIG. 2 will be described. Assume that the bi-state driver circuit 200 is in the recessive state, i.e. the output terminal 60 is in the high impedance state. By appropriately raising the voltage level 90 of the control signal above ground (ground exemplarily embodying the first predetermined voltage level 70), i.e. by offsetting the voltage level 90 of the control signal from the first predetermined voltage level 70 towards the second predetermined voltage level 80 (e.g. up to the second predetermined voltage level 80), the first transistor 11-1 is switched to the (fully) conducting state, and also the first transistor 31-1-1 in the third string 31-1 is switched to the (fully) conducting state. At the same time, since the voltage level 95 of the inverted version of the control signal is lowered below the supply voltage, the respective first transistors 21-1-1, 21-2-1 in each of the second strings 20-1, 20-2 are switched to the (fully) conducting state. Accordingly, the voltage level at the gate terminal of the second transistor 11-2 in the first string 10 is raised to the supply voltage (the supply voltage exemplarily embodying the second predetermined voltage level 80) and the voltage level at the source terminal of said second transistor 11-2 is lowered towards ground. Thereby, the second transistor 11-2 in the first string 10 is switched to the (fully) conducting state. Further, the voltage level at the gate terminal of the second transistor 21-2-2 in the second one 20-2 of the second strings is lowered to ground by the first transistor 31-1-1 in the third string switching to the (fully) conducting state, and the voltage level at the source terminal of said second transistor 21-2-2 is raised to the supply voltage. Thereby, also the second transistor 21-2-2 in the second one 20-2 of the second strings is switched to the (fully) conducting state. Accordingly, the voltage level at the gate terminal of the third transistor 11-3 in the first string 10 is raised to the supply voltage (exemplarily embodying the second predetermined voltage level 80) and the voltage level at the source terminal of said third transistor 11-3 is lowered towards ground. Thereby, the third transistor 11-3 in the first string 10 is switched to the (fully) conducting state. Thus, each of the transistors 11 in the first string 10 can be stably switched to the (fully) conducting state regardless of a voltage level at the output terminal 60, i.e. even for voltage levels at the output terminal 60 lying outside of the voltage range bounded by the first predetermined voltage level 70 and the second predetermined voltage level 80. Further, excessive gate-drain voltages (as well as gate-source and gate-well/bulk voltages) at the first to third transistors 11-1, 11-2, 11-3 of the first string 10 are prevented. By switching each of the transistors 11 in the first string 10 to the (fully) conducting state, the output terminal 60 is switched to the first predetermined voltage level 70 (i.e. ground in the present example; first state).

Figure 9:
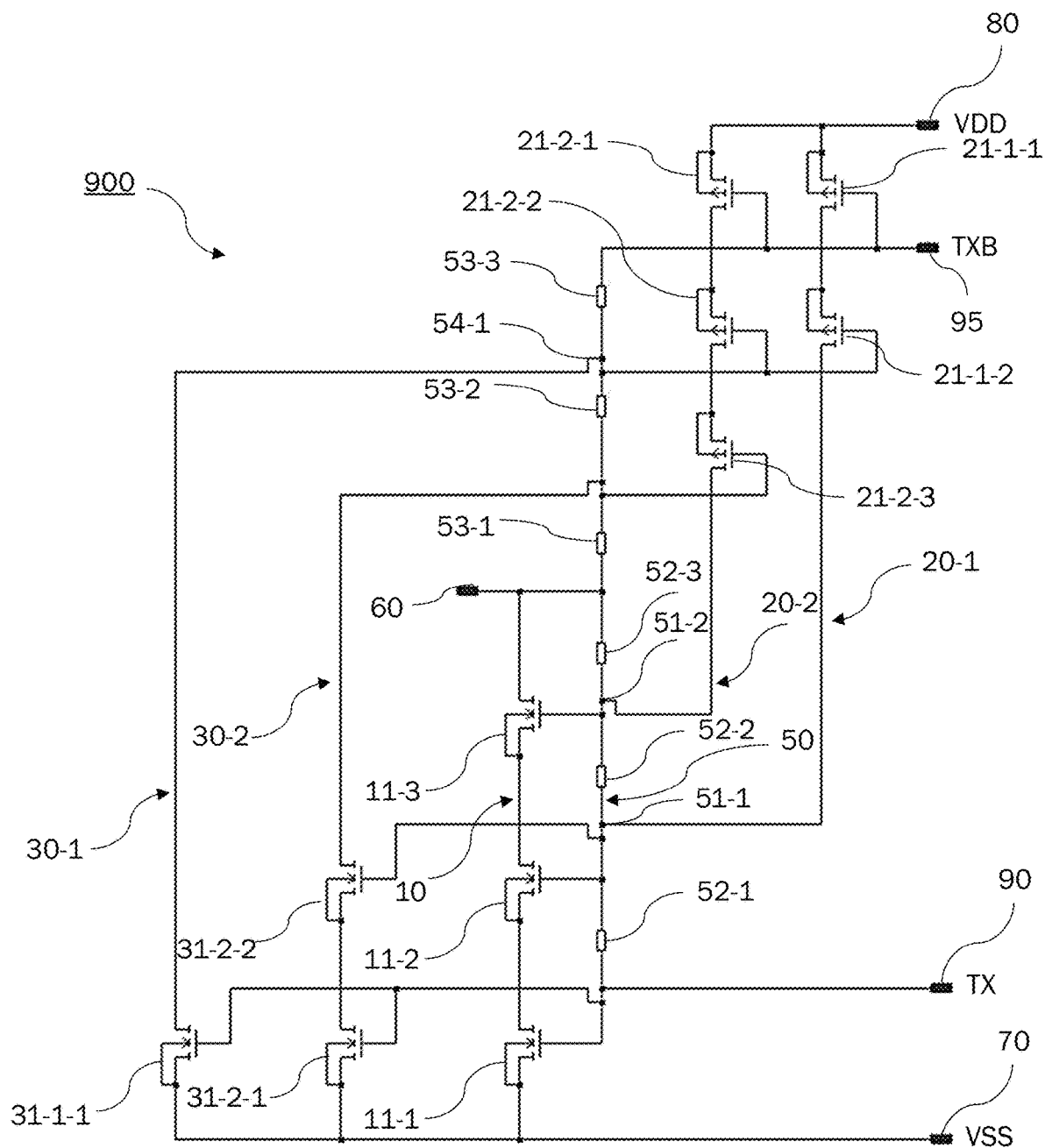

FIG. 9 schematically illustrates an example of a variation of the bi-state driver circuit 200 illustrated in FIG. 2. Only differences with respect to the bi-state driver circuit 200 of FIG. 2 will be described. In addition to the elements of the bi-state driver circuit 200 described above, the bi-state driver circuit 900 illustrated in this figure comprises an additional transistor in each second string 20-1, 20-2. Thus, the first one 20-1 of the second strings comprises two transistors 21-1-1, 21-1-2, and the second one 20-2 of the second strings comprises three transistors 21-2-1, 21-2-2, 21-2-3. A control terminal of the second transistor 21-1-2 (counting from the second predetermined voltage level 80) of the first one 20-1 of the second strings is connected to the control terminal of the second transistor 21-2-2 (counting from the second predetermined voltage level 80) of the second one 20-2 of the second strings. In order to be able to switch the third transistor 21-2-3 (counting from the second predetermined voltage level 80) of the second one 20-2 of the second strings, an additional third string 30-2 of transistors is provided. The additional third string 30-2 is connected between the first predetermined voltage level 70 and a control terminal of said third transistor 21-2-3 of the second one 20-2 of the second strings, and comprises two transistors 31-2-1, 31-2-2. The transistor 31-2-1 among the transistors of the additional third string 30-2 that is arranged closest to the first predetermined voltage level 70 is switched (driven) in accordance with the control signal, in a phase-locked relationship with the transistor 11-1 in the first string 10 that is arranged closest to the first predetermined voltage level 70, e.g. in phase with the transistor 11-1 in the first string 10 that is arranged closest to the first predetermined voltage level 70. For example, a control terminal of this transistor may be connected to the voltage level 90 of the control signal. A control terminal of the other one 31-2-2 of the transistors of the additional third string 30-2 is connected to the control terminal of the second transistor 11-2 (counting from the first predetermined voltage level 70) of the first string 10 (i.e. to the first intermediate node 51-1 of the voltage divider circuit 50, counting from the voltage level 90 of the control signal).

Providing the additional transistor in each of the second strings results in a reduction of the voltage drop across the terminals (especially the gate-drain voltage) of the transistors 21 in the second strings 20 and therefore further increases the high-voltage resilience of the bi-state driver circuit 900. Providing the additional third string 30-2 ensures appropriate switching of the third transistor 21-2-3 in the second one 20-2 of the second strings.

The above description of the variation of the bi-state driver circuit relates to the case of N=3. In the general case, each m-th second string 20-m, where m=1, . . . , N−1, comprises (at least) m+1 transistors 21-m-1, . . . , 21-m-[m+1]. An additional third string (i.e. (N−1)-th third string) 30-[N−1] comprising (at least) N−1 transistors 31-[N−1]-1, . . . , 31-[N−1]-[N−1] is connected between the first predetermined voltage level 70 and a control terminal of the N-th transistor 21-[N−1]-N of the (N−1)-th second string 20-[N−1]. A first transistor 31-[N−1]-1 (counting from the first predetermined voltage level 70) of the additional third string 30-[N−1] is switched in accordance with the control signal, in a phase-locked relationship with the first transistor 11-1 (counting from the first predetermined voltage level 70) of the first string 10, e.g. in phase with said first transistor 11-1 of the first string 10. Control terminals of the second to (N−1)-th transistors 31-[N−1]-2, . . . , 31-[N−1]-[N−1] of the additional third string 30-[N−1] are connected to control terminals of the second to (N−2)-th transistors 11-2, . . . , 11-[N−2] of the first string 10, i.e. to those intermediate nodes to which respective control terminals of said second to (N−2)-th transistors 11-2, . . . , 11-[N−2] of the first string 10 are connected.

Figure 10:
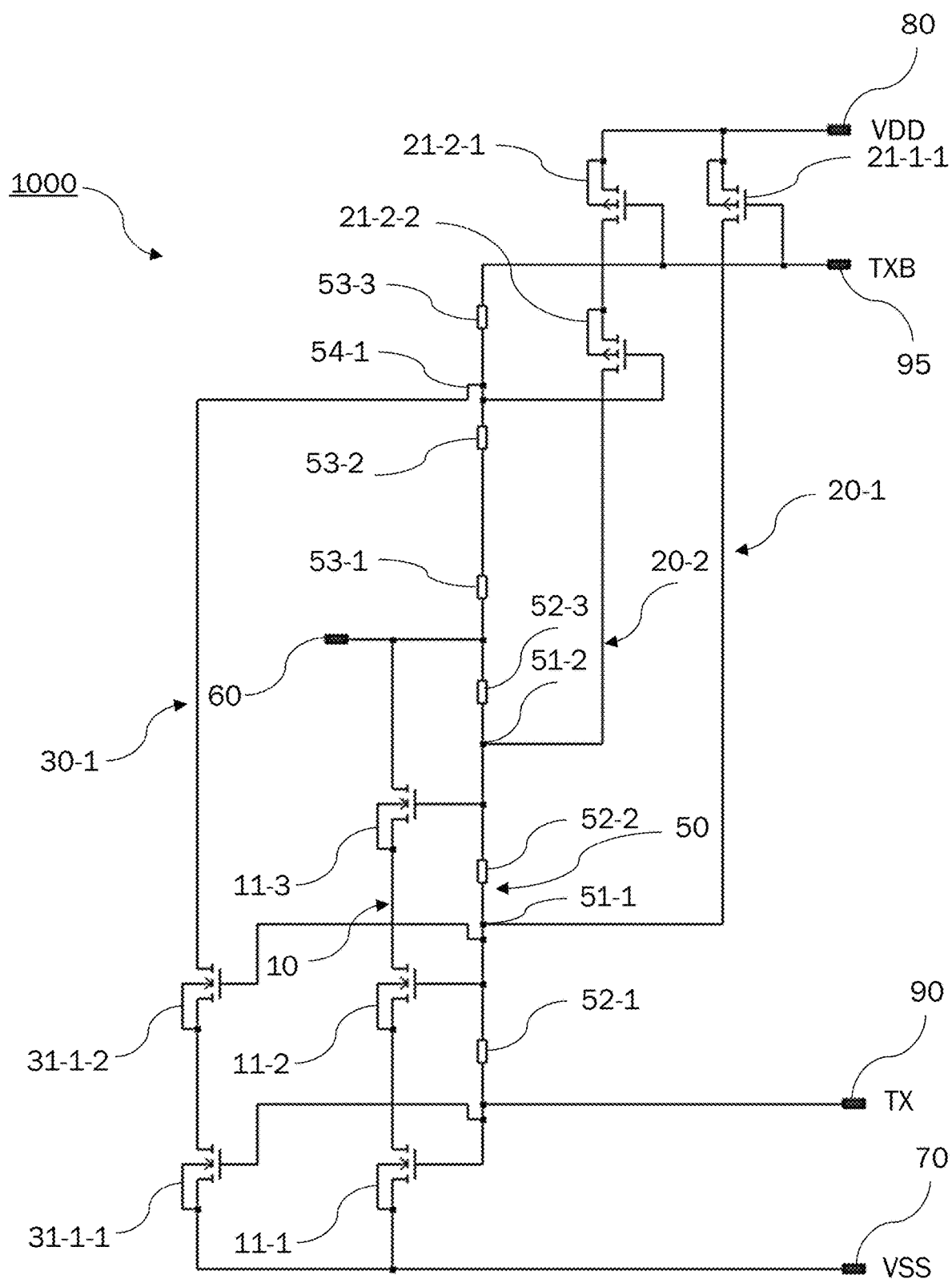

FIG. 10 schematically illustrates another example of a variation of the bi-state driver circuit 200 illustrated in FIG. 2. Only differences with respect to the bi-state driver circuit 200 of FIG. 2 will be described. In addition to the elements of the bi-state driver circuit 200 described above, the bi-state driver circuit 1000 illustrated in this figure comprises an additional transistor 31-1-2 in the third string 30-1. A control terminal of this additional transistor is connected to the control terminal of the second transistor 11-2 (counting from the first predetermined voltage level 70) of the first string 10 (i.e. to the respective intermediate node 51 of the voltage divider circuit 50).

Providing the additional transistor 31-1-2 in the third string 30-1 results in a reduction of the voltage drop across the terminals (especially the gate-drain voltage) of the transistor 31-1-1 in the third string 30-1 and therefore further increases the high-voltage resilience of the bi-state driver circuit 1000.

The above description of the variation of the bi-state driver circuit relates to the case of N=3. In the general case, each n-th third string 30-n, where n=1, . . . , N−2, comprises (at least) n+1 transistors 30-n-1, . . . , 30-n-[n+1]. A control terminal of the (n+1)-th transistor 31-n-[n+1] (counting from the first predetermined voltage level 70) in each n-th third string 30-n is connected to the control terminal of the (n+1)-th transistor 11-[n+1] (counting from the first predetermined voltage level 70) of the first string 10 (i.e. to the respective intermediate node 51 of the voltage divider circuit 50).

Figure 11:
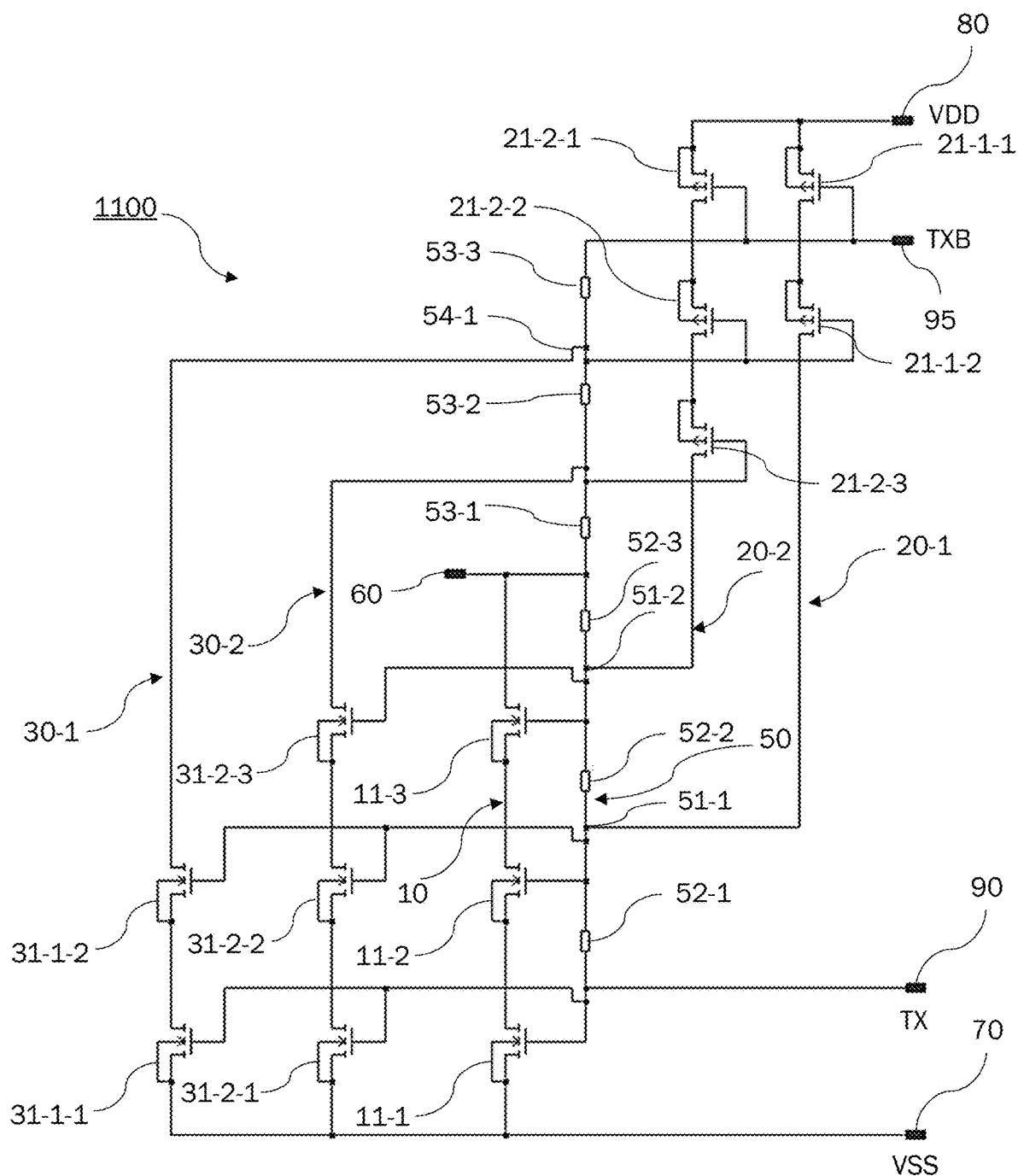

FIG. 11 schematically illustrates another example of a variation of the bi-state driver circuit 200 illustrated in FIG. 2. Only differences with respect to the bi-state driver circuit 900 of FIG. 9 will be described. In addition to the elements of the bi-state driver circuit 900 described above, the bi-state driver circuit 1100 illustrated in this figure comprises an additional transistor 31-1-2 in the third string 30-1, arranged farthest from the first predetermined voltage level 70, and an additional transistor 31-2-3 in the additional third string 30-2, arranged farthest from the first predetermined voltage level 70. A control terminal of the additional transistor 31-1-2 in the third string 30-1 is connected to the control terminal of the second transistor 11-2 (counting from the first predetermined voltage level 70) among the N transistors in the first string 10, and a control terminal of the additional transistor 31-2-3 in the additional third string 30-2 is connected to the control terminal of the third transistor 11-3 (counting from the first predetermined voltage level 70) of the first string 10 (i.e. to the second intermediate node 51-2 of the voltage divider circuit 50, counting from the voltage level 90 of the control signal).

Providing the additional transistors in the third string 30-1 and in the additional third string 30-2 results in a reduction of the voltage drop across the terminals (especially the gate-drain voltage) of the transistor 31-1-1 in the third string 30-1 and the transistors 31-2-1, 31-2-2 in the additional third string 30-2 and therefore further increases the high-voltage resilience of the bi-state driver circuit 1100. Moreover, a positive feedback loop including the second transistor 31-1-2 of the third string 30-1 is provided which aids to reduce a settling time of the bi-state driver circuit 1100 upon switching.

The above description of the variation of the bi-state driver circuit relates to the case of N=3. In the general case, each n-th third string 30-$n$, where n=1, ..., N−2, comprises (at least) n+1 transistors 31-$n$-1, ..., 31-$n$-[$n$+1]. A control terminal of the (n+1)-th transistor 31-$n$-[$n$+1] (counting from the first predetermined voltage level 70) in each n-th third string 30-$n$ is connected to the control terminal of the (n+1)-th transistor 11-[$n$+1] (counting from the first predetermined voltage level 70) of the first string 10 (i.e. to the respective intermediate node 51-$n$ of the voltage divider circuit 50). The additional third string (i.e. (N−1)-th third string) 30-[N−1] comprises (at least) N transistors 31-[N−1]-1, ..., 31-[N−1]-N. A control terminal of the N-th transistor 31-[N−1]-N (counting from the first predetermined voltage level 70) of the additional third string 30-[N−1] is connected to the control terminal of the N-th transistor 11-N (counting from the first predetermined voltage level 70) of the first string (i.e. to the respective intermediate node 51-[N−1] of the voltage divider circuit 50).

As can be seen e.g. from FIG. 9 to FIG. 11, the second and third strings may in principle comprise a greater number of transistors than the respective numbers stated above and in the remainder of the present disclosure. The stated numbers thus may be understood to represent minimum numbers. For example, any or each of the third strings may comprise up to N transistors. Likewise, any or each of the second strings may comprise up to N transistors. Control terminals of the additional transistors in the second and third strings may have connections to the (intermediate nodes of the) additional voltage divider circuit is and the (intermediate nodes of the) voltage divider circuit 50, respectively, in accordance to those of the transistors in the (N−1)-th second string 20-[N−1] and the first string 10, respectively. For up to N transistors in a given third string, their control terminals may be connected, respectively, to the voltage level of the control signal and to respective ones of the N−1 intermediate nodes of the voltage divider circuit 50. In other words, control terminals of the first additional transistor and further transistors in a given third string, counting from the first predetermined voltage level, may be connected, in the order of their arrangement in the given third string from the first predetermined voltage level towards the output terminal, to respective intermediate nodes of the voltage divider circuit 50, in the order of their intermediate voltage levels, from the voltage level of the control signal to the voltage level of the output terminal. In general, the control terminals of respective q-th transistors, q=1, ..., N, in the third strings may be connected to a common node, e.g. control terminals of respective first transistors in the third strings, counting from the first predetermined voltage level, may be connected to the voltage level of the control signal, and control terminals of respective N-th transistors in the third strings, counting from the first predetermined voltage level, may be connected to the same intermediate node of the voltage divider circuit 50 as the control terminal of the N-th transistor 11-N of the first string 10, counting from the first predetermined voltage level, and so forth. For up to N transistors in a given second string, their control terminals may be connected, respectively, to the voltage level obtained by inverting the voltage level of the control signal and to respective ones of the intermediate nodes of the additional voltage divider circuit (in this case, the additional voltage divider circuit may have at least N−1 intermediate nodes). In other words, control terminals of the first additional transistor and further transistors in a given second string, counting from the second predetermined voltage level, may be connected, in the order of their arrangement in the given second string from the second predetermined voltage level towards the output terminal, to respective intermediate nodes of the additional voltage divider circuit, in the order of their intermediate voltage levels, from the voltage level obtained by inverting the voltage level of the control signal to the voltage level of the output terminal. In general, the control terminals of respective r-th transistors, r=1, ..., N, in the second strings may be connected to a common node, e.g. control terminals of respective first transistors in the second strings, counting from the second predetermined voltage level, may be connected to the voltage level obtained by inverting the voltage level of the control signal, and control terminals of respective N-th transistors in the second strings, counting from the second predetermined voltage level, may be connected to the additional (i.e. (N−1)-th) third string, and so forth.

Figure 3:
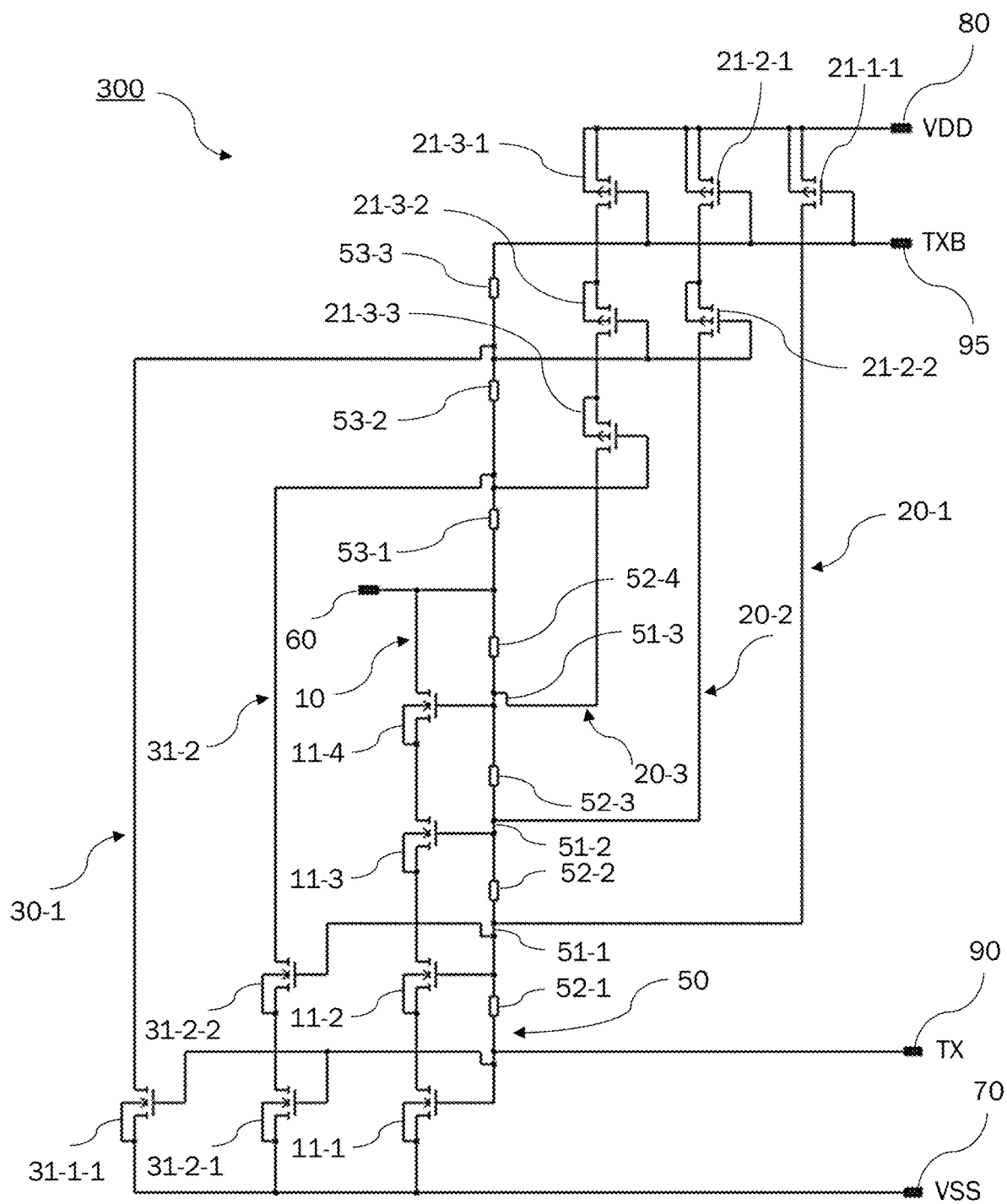

A pull-down circuit for the case of N=4 is shown in FIG. 3 as another example of a bi-state driver circuit 300 according to embodiments of the disclosure.

FIG. 4 schematically illustrates an example of a variation of the bi-state driver circuit 300 illustrated in FIG. 3. In the bi-state driver circuit 400 of FIG. 4, the voltage divider circuit 50 comprises a main string of resistors 52-1, ..., 52-4 connected between the output terminal 60 and the voltage level 90 of the control signal. A first group of intermediate nodes 51-1, ..., 51-3 is formed by intermediate nodes respectively arranged between adjacent resistors of the main string of resistors. The control terminals of the transistors 11 of the first string 10 of transistors are connected to respective intermediate nodes in the first group. The voltage divider circuit 50 further comprises one or more secondary strings of resistors 54-1, 54-2 (e.g. one secondary string in the example of FIG. 4). Therein, each secondary string of resistors is connected between one of the intermediate nodes of the first group (e.g. intermediate node 51-2 in the present example) and the voltage level 90 of the control signal. A second group of intermediate nodes is formed by intermediate nodes (e.g. single intermediate node 55-1 in the present example) respectively arranged between adjacent resistors of the one or more secondary strings of resistors. In this configuration, the control terminal of at least one of the transistors of one of the third strings (e.g. the second transistor 31-2-2 in the second one 30-2 of the third strings in the present example) is connected to an intermediate node in the second group (e.g. intermediate node 55-1 in the present example).

Figure 6:
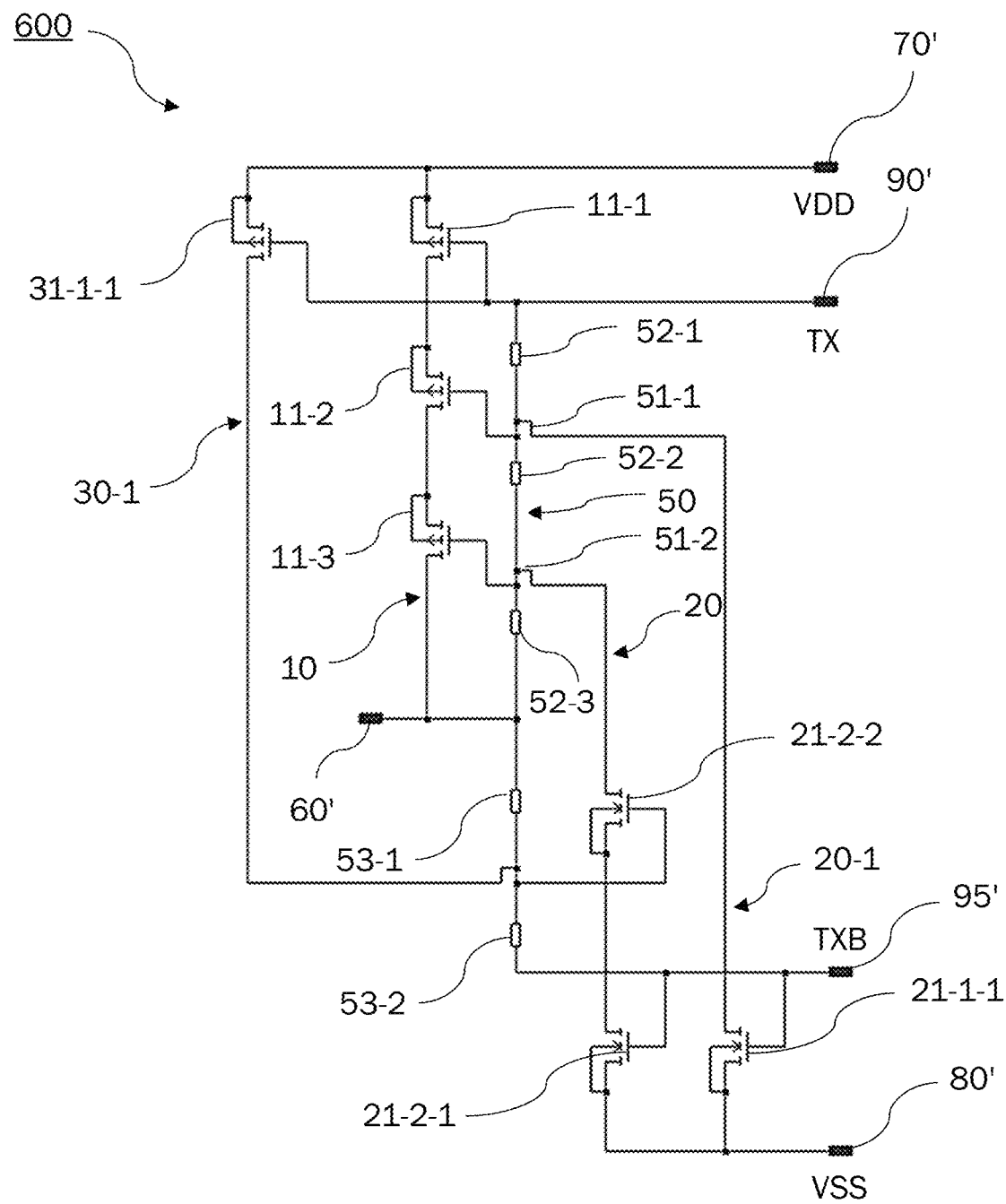

FIG. 6 schematically illustrates a pull-up circuit as an example of a bi-state driver circuit 600 according to embodiments of the disclosure. The bi-state driver circuit 600 illustrated in FIG. 6 corresponds to the bi-state driver circuit 200 illustrated in FIG. 2, with the difference that the first predetermined voltage level 70' now corresponds to the (positive) supply voltage (VDD), and that the second predetermined voltage level 80' now corresponds to ground (VSS). Hence, the bi-state driver circuit 600 in this figure corresponds to a pull-up circuit, i.e. may be used for switching the output terminal 60' between the first predetermined voltage level (i.e. the supply voltage in the present example; first state) and a high impedance state (second state).

Notably, also pull-up circuits corresponding to the variations illustrated in FIG. 9 to FIG. 11 may be obtained by inverting (flipping) respective assignments of the supply voltage and ground to the first predetermined voltage level and the second predetermined voltage level. In other words, a respective pull-up circuit may be obtained from any of the pull-down circuits described above by interchanging the roles of the first and second predetermined voltage levels, and vice versa. Pull-up circuits and pull-down circuits may thus be said to be complementary, with functions of their respective PMOS and NMOS transistors interchanged.

The bi-state driver circuits described above relate to an integrated circuit solution with which the external voltage range that may be applied to the bi-state driver circuit can be significantly increased to multiple times the supply voltage even for a bi-state output driver implemented with only low-voltage transistors. Apart from being employed as bi-state circuits or bi-state pull-down circuits, the bi-state driver circuits described throughout the present disclosure may also be used to form tri-state buffer circuits (tri-state driver circuits) and CAN driver circuits, or driver circuits for any other bi-directional differential communication bus.

Figure 12:
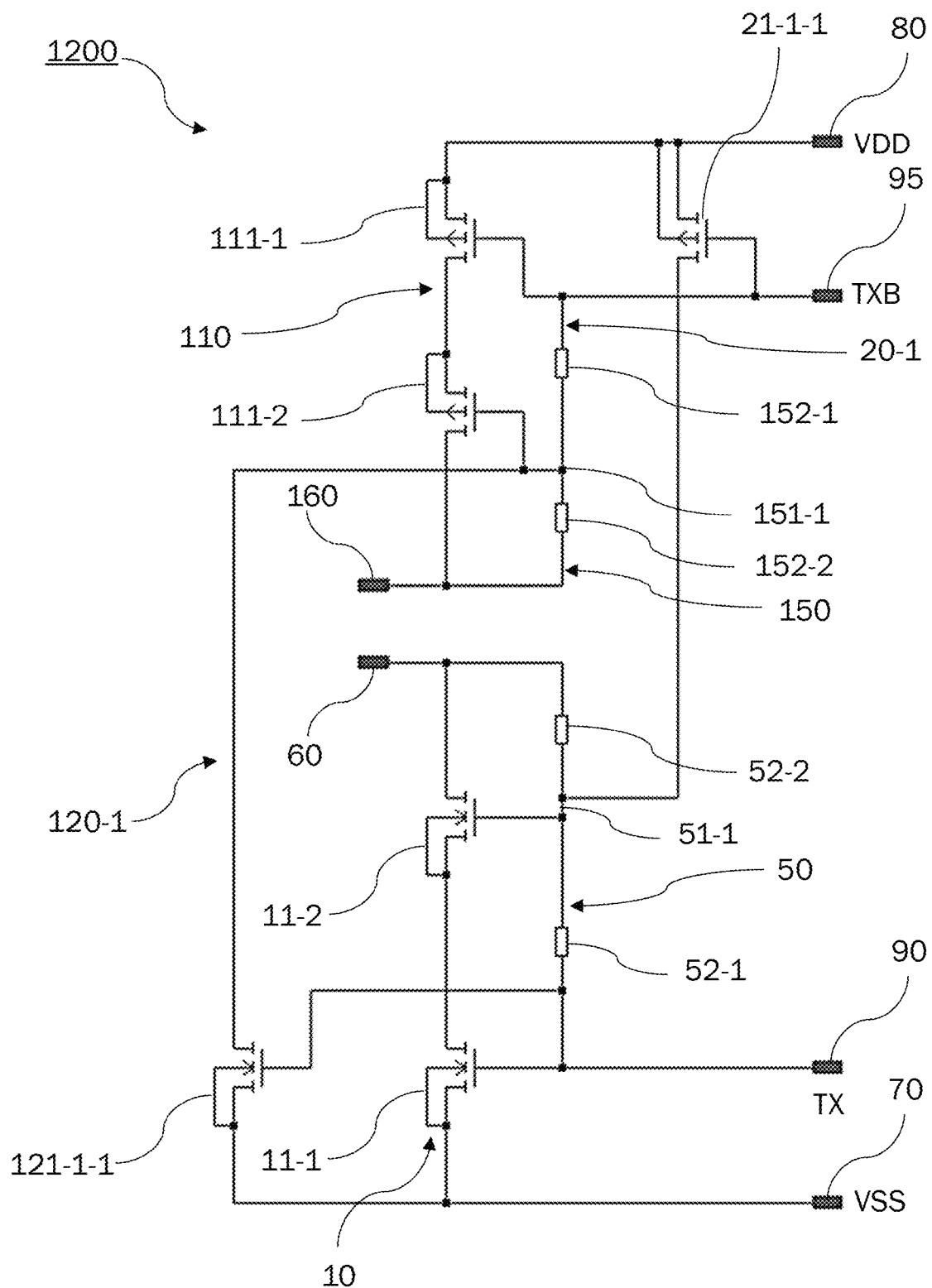

An example of a driver circuit 1200 according to embodiments of the disclosure for switching a first output terminal 60 between a first output voltage level and a high impedance state and for switching a second output terminal 160 between a second output voltage level and the high impedance state is schematically illustrated in FIG. 12.

The driver circuit 1200 shown in FIG. 12 comprises a first bi-state driver circuit implementing a pull-down circuit (comprising, among others, transistors 11-1, 11-2, and 21-1-1), for which the first predetermined voltage level 70 is the first output voltage level, and for which the second predetermined voltage level 80 is the second output voltage level. The first output terminal 60 of the driver circuit 1200 is implemented by the output terminal of the first bi-state driver circuit. The driver circuit 1200 further comprises a second bi-state driver circuit implementing a pull-up circuit (comprising, among others, transistors 111-1, 111-2, and 121-1-1), for which the second predetermined voltage level 80 is the first output voltage level, and for which the first predetermined voltage level 70 is the second output voltage level. The second output terminal 160 of the driver circuit 1200 is implemented by the output terminal of the second bi-state driver circuit. The first and second bi-state driver circuits are complements of each other, and are connected between the first and second output voltage levels in reverse polarity compared to each other. Notably, the driver circuit of FIG. 12 comprises two bi-state driver circuits 100 as shown in FIG. 1, although two (preferably complementary) bi-state driver circuits illustrated in any one of FIG. 1 through FIG. 11 might be comprised as well.

In the dominant state of the driver circuit 1200, both the pull-up circuit and the pull-down circuit are active and the H and L bus lines (i.e. the second and first output terminals, respectively) are respectively pulled towards the supply voltage (second output voltage level) and ground (first output voltage level). For the recessive state, both the pull-up circuit and the pull-down circuit are de-activated and the bus line voltages may range from −3V to +16V.

A tri-state driver for switching an output terminal between a first output voltage level, a second output voltage level and a high impedance state could be obtained from the driver circuit 1200 by unifying the first and second output terminals 60, 160 to form the output terminal of the tri-state driver circuit.

Figure 13:
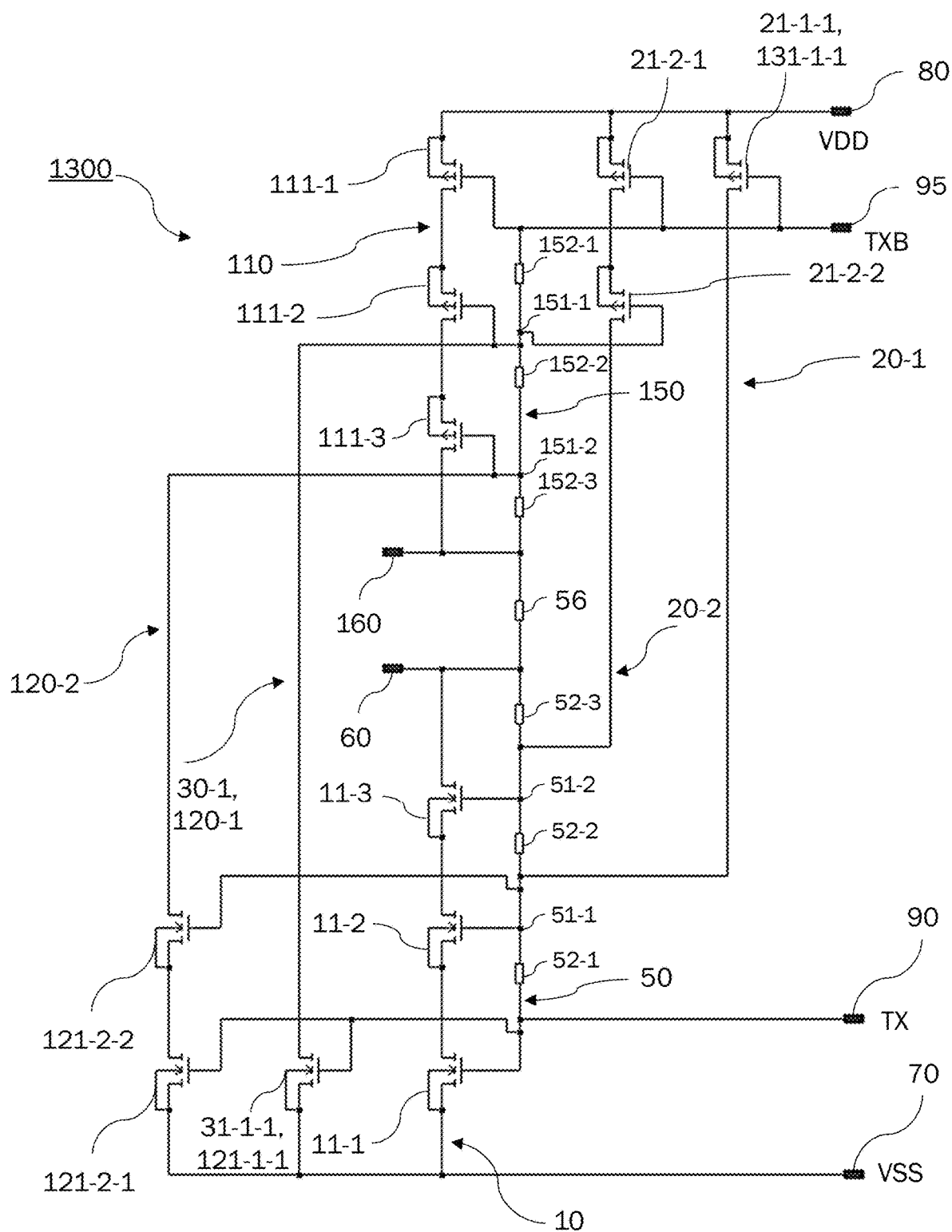

Another example of a driver circuit 1300 according to embodiments of the disclosure for switching a first output terminal between a first output voltage level and a high impedance state and for switching a second output terminal between a second output voltage level and the high impedance state is schematically illustrated in FIG. 13.

The driver circuit 1300 shown in FIG. 13 comprises a first bi-state driver circuit implementing a pull-down circuit (comprising, among others, transistors 11-1, 11-2, 11-3, 21-1-1, 21-2-1, 21-2-2, and 31-1-1), for which the first predetermined voltage level 70 is the first output voltage level, and for which the second predetermined voltage level 80 is the second output voltage level. The first output terminal 60 of the driver circuit 1300 is implemented by the output terminal of the first bi-state driver circuit. The driver circuit 1300 further comprises a second bi-state driver circuit implementing a pull-up circuit (comprising, among others, transistors 111-1, 111-2, 111-3, 121-1-1, 121-2-1, 121-2-2, and 131-1-1), for which the second predetermined voltage level 80 is the first output voltage level, and for which the first predetermined voltage level 70 is the second output voltage level. The second output terminal 160 of the driver circuit 1300 is implemented by the output terminal of the second bi-state driver circuit. The first and second bi-state driver circuits are complements of each other, and are connected between the first and second output voltage levels in reverse polarity compared to each other. Notably, the driver circuit 1300 of FIG. 13 comprises two bi-state driver circuits 200 as shown in FIG. 2, although two (preferably complementary) bi-state driver circuits illustrated in any one of FIG. 1 through FIG. 11 might be comprised as well.

The two bi-state driver circuits of the driver circuit 1300 may share at least one component (e.g. transistor). In the present example, the third string 30-1 of the first bi-state driver circuit is implemented by (i.e. shares its components with) the first one 20-1 of the second string 120-1 of the second bi-state driver circuit. In general, the first to (N−2)-th second strings 20-1, . . . 20-[N−2] of the first one of the bi-state driver circuits may be implemented by the first to (N−2)-th third strings 130-1, . . . , 130-[N−2] of the second one of the bi-state driver circuits, and vice versa. Likewise, the first to (N−2)-th third strings 30-1, . . . , 30-[N−2] of the first one of the bi-state driver circuits may be implemented by the first to (N−2)-th second strings 120-1, . . . , 120-[N−2] of the second one of the bi-state driver circuits, and vice versa. Thus, second strings of either one bi-state driver circuit may be implemented by (i.e. share components with) respective third strings of the other one of the bi-state driver circuits, given that respective second and third strings have the same number of transistors.

A tri-state driver for switching an output terminal between a first output voltage level, a second output voltage level and a high impedance state could be obtained from the driver circuit 1300 by unifying the first and second output terminals 60, 160 to form the output terminal of the tri-state driver circuit.

Figure 14A:
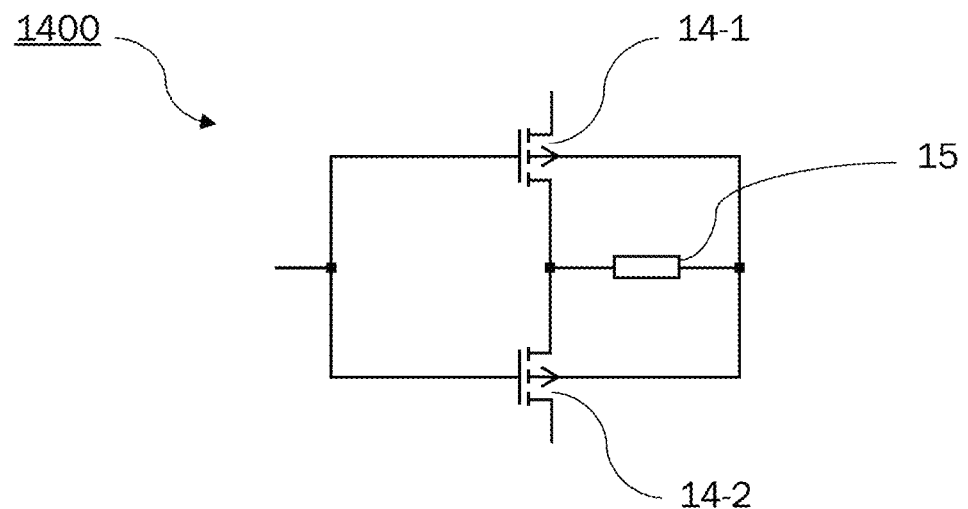
Figure 14B:
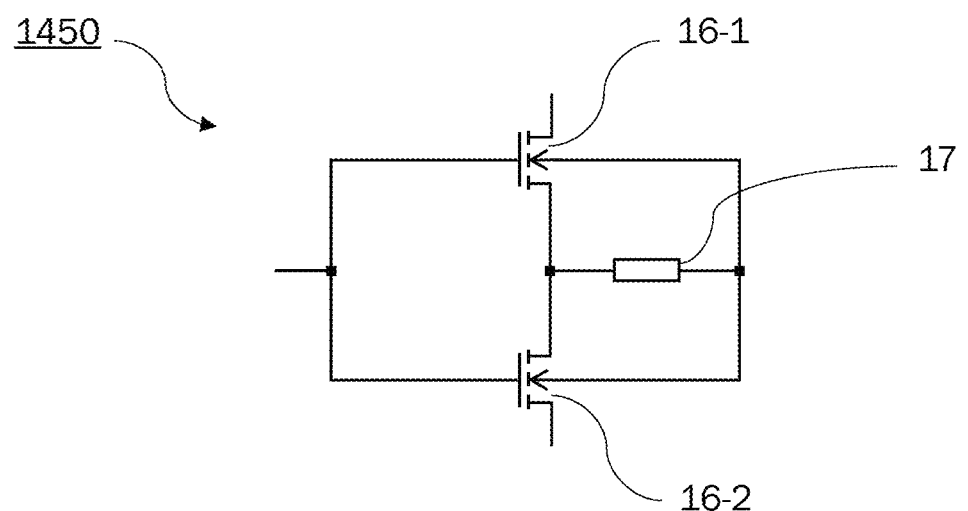

When using MOSFET transistors, (reverse) leakage currents flowing though the wells of the transistors may occur. Occurrence of such leakage currents may be avoided by replacing some or all of the transistors of any bi-state driver circuit described above by MOSFET transistors that are joined in pairs within one well (paired transistor units). Examples of paired transistors of this type are schematically shown in FIG. 14A (PMOS transistors) and FIG. 14B (NMOS transistors). A source terminal of one of the paired transistors is connected to a drain terminal of the other one of the paired transistors. Further, the gate terminals of the paired transistors 14-1, 14-2, 16-1, 16-2 are connected to each other, and the bulk terminals are both connected to an intermediate voltage level between said source and drain terminals through a resistance 15, 17. In other words, the paired transistors may be well-connected. While all of the transistors of the bi-state driver circuits (and tri-state driver circuits and driver circuits) described above may be replaced by such pairs of transistors, a case is feasible in which only a given number of transistors in respective first strings 10 closest to the output terminal 60 are replaced, e.g. a number of transistors 11 in the first string 10 that are arranged closest to the output terminal 60.

Notably, in FIG. 1 through FIG. 14 all transistors are illustrated as enhanced p-channel and n-channel MOSFETs with respective source and bulk terminals shorted. However, the present disclosure shall not be construed to be limited to such types of transistors and also other types of transistors are understood to be covered by the present disclosure, such as FETs and other types of MOSFETS, for example.

Further, all transistors referred to throughout the present disclosure may be rated nominally 3.3V transistors with a maximum gate-drain and gate-source voltages of about 3.6V. All bi-state driver circuits, tri-state driver circuits and driver circuits described throughout the disclosure may be compliant to the −3V to +16V CAN line voltage range.

Yet further, while reference is made in the present disclosure to CAN driver circuits and CAN communication buses, the present disclosure is understood to cover also other driver circuits for other bi-directional communication buses.

Broadly speaking, the present disclosure may be summarized as follows. The disclosed bi-state driver circuits are resilient to the application of high external voltages that may be multiple times the supply voltage of the bi-state driver circuit. The disclosed bi-state driver circuits may be employed as either pull-up or pull-down circuits in bi-state output drivers and tri-state output drivers, or as bi-state outputs of a driver circuit such as a CAN driver circuit (CAN output driver), for example.

The bi-state driver circuits described in the present disclosure comprise an output driver made up of a series-connected transistor string (i.e. the first string 10), whose gates are attached to the intermediate nodes of a voltage divider circuit 50 e.g. implemented by a resistor string spanning the output terminal and driver input (i.e. the voltage level 90 of the control signal).

In order to assist the driver input signal (i.e. control signal) activating the bi-state driver circuit into an active state, a complementary staged pull-up/pull-down circuit, i.e. pre-driver (comprising the second and third strings), is added. The gates of the pre-driver are connected again to a resistor string from the output terminal to the driver input signal and its complement. Once a given stage of the pre-driver is fully activated (i.e. pull a current through the resistor string) it will activate the next stage up until the point that also the transistors closest to the output terminal are switched to the fully conducting state.

With the driver not active (i.e. in the absence of the control signal), the output driver transistor string and also the pre-driver transistor strings for both pull-up and pull-down are all off, with the respective source, gate, drain and well voltage having such values that do not compromise the oxide integrity. The leakage through the well may be minimized by means of common well biasing for pairs of transistors described further below. Leakage through the transistor is minimized by ensuring that the gate source voltage is always below the threshold voltage. With these arrangements the output pad (output terminal) applied voltage is allowed to increase and pass the supply or decrease to pass the ground potential without functional failure.

With the driver passing into active mode, the gates of the transistors of the transistor strings of the pre-driver that are closest to ground (in the case of a pull-down circuit) or closest to the supply voltage (in the case of a pull-up circuit) are fully activated. Their output ensures that the second level of the pre-driver gates will be fully biased, who in turn ensure that the ensuing, and eventually last, level of pre-driver gates are properly biased. This staged approached to activating the transistor ensures that only those transistors are fully activated that are within the safe operating range of the transistors. Although the pre-driver gates could be connected to the resistor string of the driver, for reasons of predicable operation it is preferable to have a separate resistor string from the output pad (or a connection point close to the output pad) to the control signal.

In order to prevent reverse voltage leakage, paired transistors instead of single transistors may be employed in the transistor strings, and a common well connection may be applied to the paired transistors in the transistor strings.

The maximum voltage that can be applied to the output terminal of the bi-state driver circuits is dependent on the leakage current through the series transistors (i.e. transistors 11 of the first string 10) of the driver, and on the number of series transistors. The larger their number, the smaller their gate-source voltages.

Thus, the length of the transistor string of the output driver (i.e. the first string 10) may be selected depending on the maximum value of an external voltage that may be applied to the output port of the bi-state driver circuit. Further, the number of stages of the pre-driver is not necessarily equal to the number of transistors in the transistor string. That is, the first string may comprise a number of transistors in excess of the number N, where the number N sets the number of stages of the pre-driver. For example, it may be sufficient to provide a pre-driver stage for every other transistor of the transistor string (first string 10). Further, only some of the transistors (e.g. the top transistors pairs in the transistor string) may be paired transistors and have a common well connection.

Having the pre-driver and the driver transistor string (output driver), bi-state driver circuits can operate in the inactive state with applied voltages multiple times their supply voltages.

Next, simulation results for bi-state driver circuits, tri-state driver circuits and communication bus driver circuits according to embodiments of the disclosure will be described with reference to FIG. 15 through FIG. 18. In these figures, abscissas indicate time, and ordinates indicate respective voltage levels.

Figure 15:
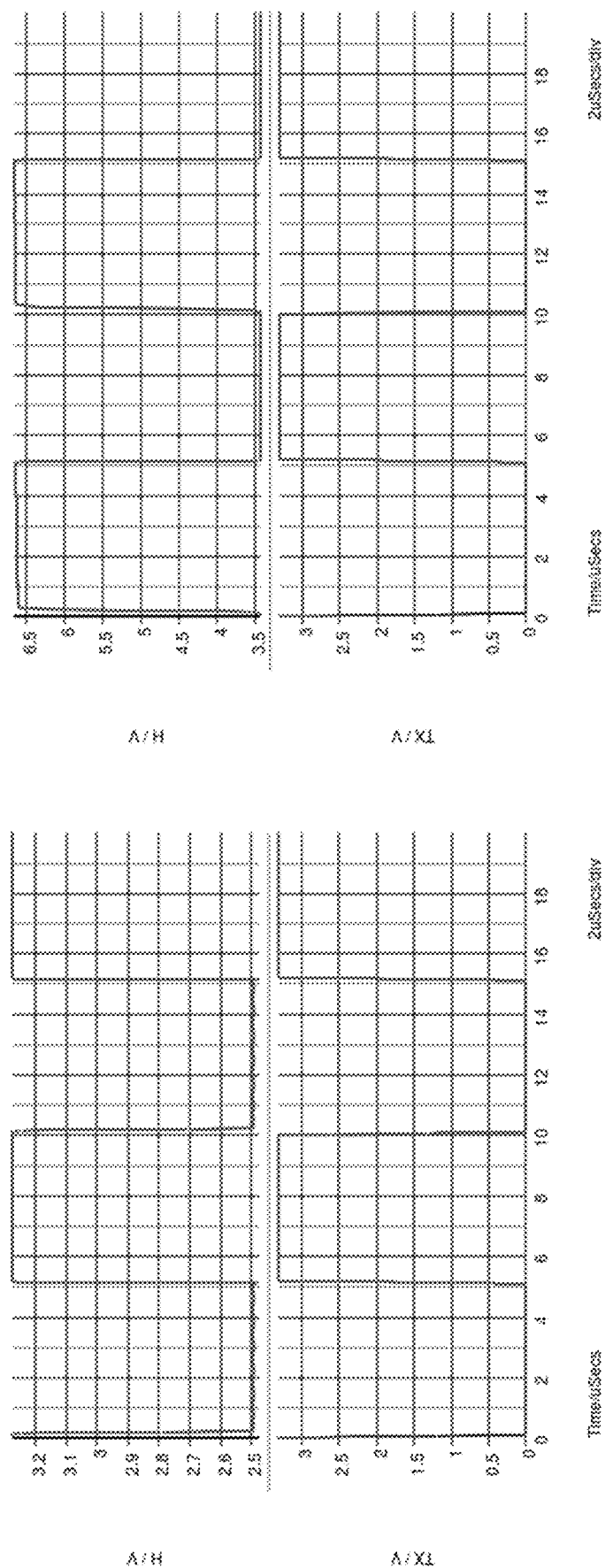
FIG. 15 illustrates simulation results for a pull-up circuit as an example of a bi-state driver circuit according to embodiments of the disclosure.

FIG. 15 illustrates simulation results for a pull-up circuit implementing a bi-state driver circuit according to embodiments of the disclosure. The left column of FIG. 15 relates to the case of an externally applied line voltage of 2.5V (compared to a supply voltage of 3.3V), and the right column relates to the case of an externally applied line voltage of 7.7V (compared to a supply voltage of 3.3V). Respective top panels illustrate the voltage level of the output terminal (H line voltage), and respective bottom panels illustrate the voltage level of the control signal (TX). In both cases, the control signal alternates between ground and the supply voltage. Further, in both cases the H line is pulled towards the supply voltage when the voltage level of the control signal is equal to the supply voltage. Accordingly, the voltage level of the output terminal alternates between a predetermined voltage level (close to the supply voltage) for periods in which the voltage level of the control signal equals the supply voltage, and a state in which the externally applied voltage is present at the output terminal (high impedance state) for periods in which the voltage level of the control signal is equal to ground. As becomes apparent especially from the right column of FIG. 15, the pull-up circuit operates correctly even for externally applied voltages in excess of the supply voltage. It has been found that the pull-up circuit operates correctly for externally applied line voltages up to 16V without breakdown.

Figure 16:
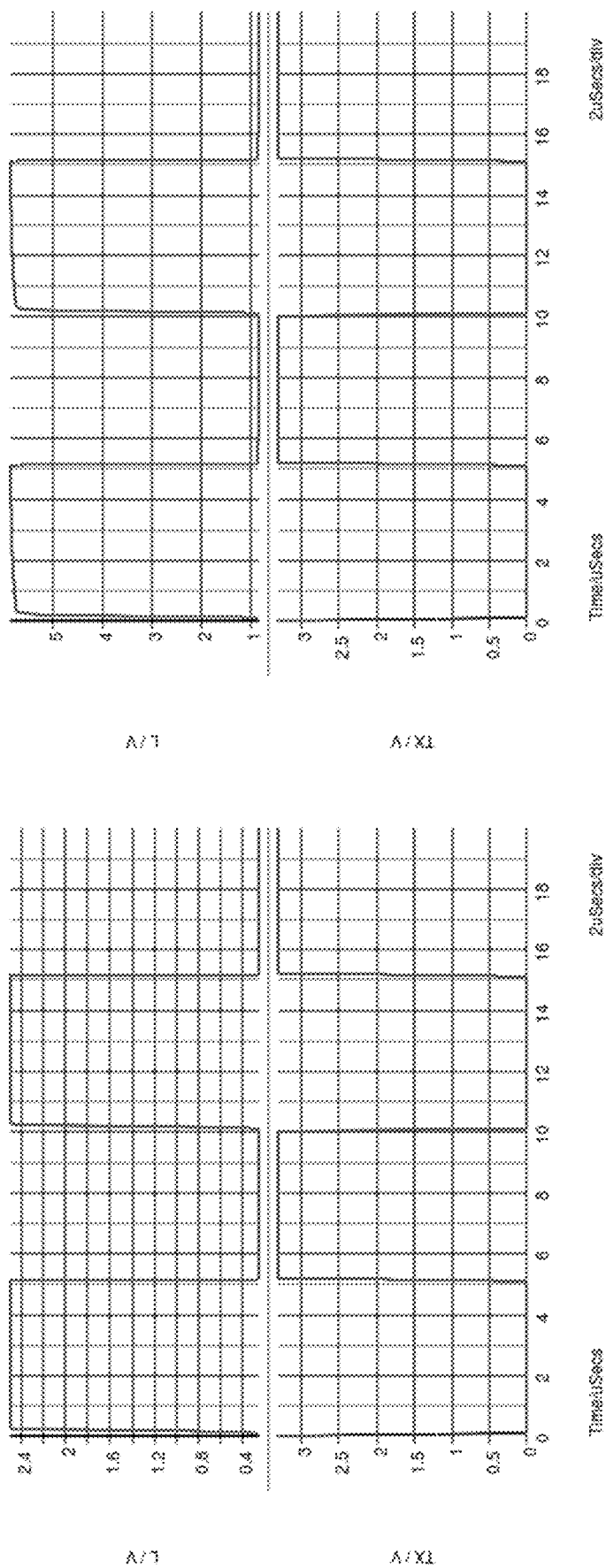
FIG. 16 illustrates simulation results for a pull-down circuit as an example of a bi-state driver circuit according to embodiments of the disclosure.

FIG. 16 illustrates simulation results for a pull-down circuit implementing a bi-state driver circuit according to embodiments of the disclosure. The left column of FIG. 16 relates to the case of an externally applied line voltage of 2.5V (compared to a supply voltage of 3.3V), and the right column relates to the case of an externally applied line voltage of 7.7V (compared to a supply voltage of 3.3V). Respective top panels illustrate the voltage level of the output terminal (L line voltage), and respective bottom panels illustrate the voltage level of the control signal (TX). In both cases, the control signal alternates between ground and the supply voltage. Further, in both cases the L line is pulled towards ground when the voltage level of the control signal is equal to the supply voltage. Accordingly, the voltage level of the output terminal alternates between a predetermined voltage level (close to ground) for periods in which the voltage level of the control signal equals the supply voltage, and a state in which the externally applied voltage is present at the output terminal (high impedance state) for periods in which the voltage level of the control signal is equal to ground. As becomes apparent especially from the right column of FIG. 16, the pull-down circuit operates correctly even for externally applied voltages in excess of the supply voltage. It has been found that the pull-down circuit operates correctly for externally applied line voltages up to 16V without breakdown.

Figure 17:
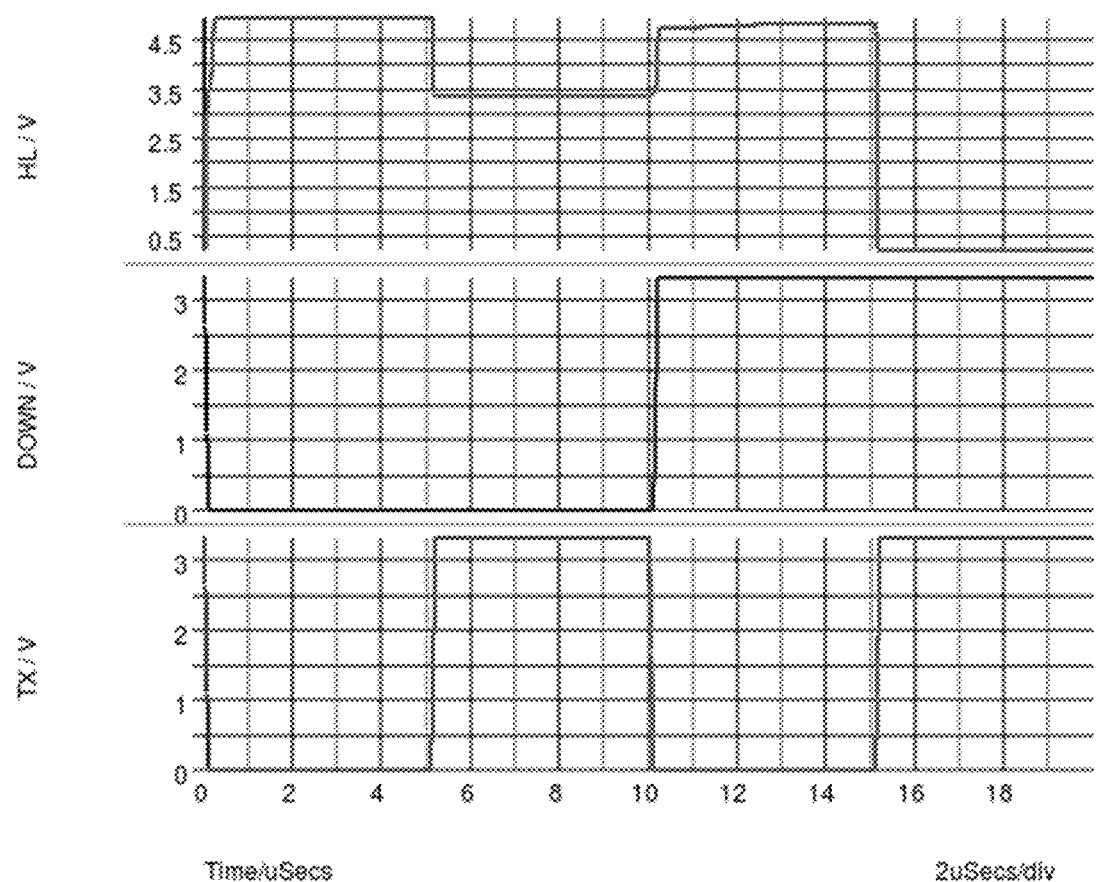
FIG. 17 illustrates simulation results for a tri-state driver circuit according to embodiments of the disclosure.

FIG. 17 illustrates simulation results for a tri-state (pull-up/pull-down) driver circuit according to embodiments of the disclosure. The externally applied line voltage is equal to 5V in this example. The top panel illustrates the voltage level of the output terminal (HL line), and the bottom panel illustrates the voltage level of the control signal (TX). The control signal alternates between ground and the supply voltage. In the first period in which the voltage level of the control signal is equal to the supply voltage, the pull-up driver circuit of the tri-state driver circuit is activated, and in the second period in which the voltage level of the control signal is equal to the supply voltage, the pull-down driver circuit of the tri-state driver circuit is activated. In the first of said periods, the HL line is pulled towards the supply voltage and the voltage level of the output terminal is close to the supply voltage. In the second one of said periods, the HL line is pulled towards ground, and the voltage level of the output terminal is close to ground. Further, the voltage level of the output terminal equals the externally applied line voltage for periods in which the voltage level of the control signal is equal to ground. As can be seen from this figure, the tri-state driver circuit operates correctly even for externally applied voltages in excess of the supply voltage.

Figure 18:
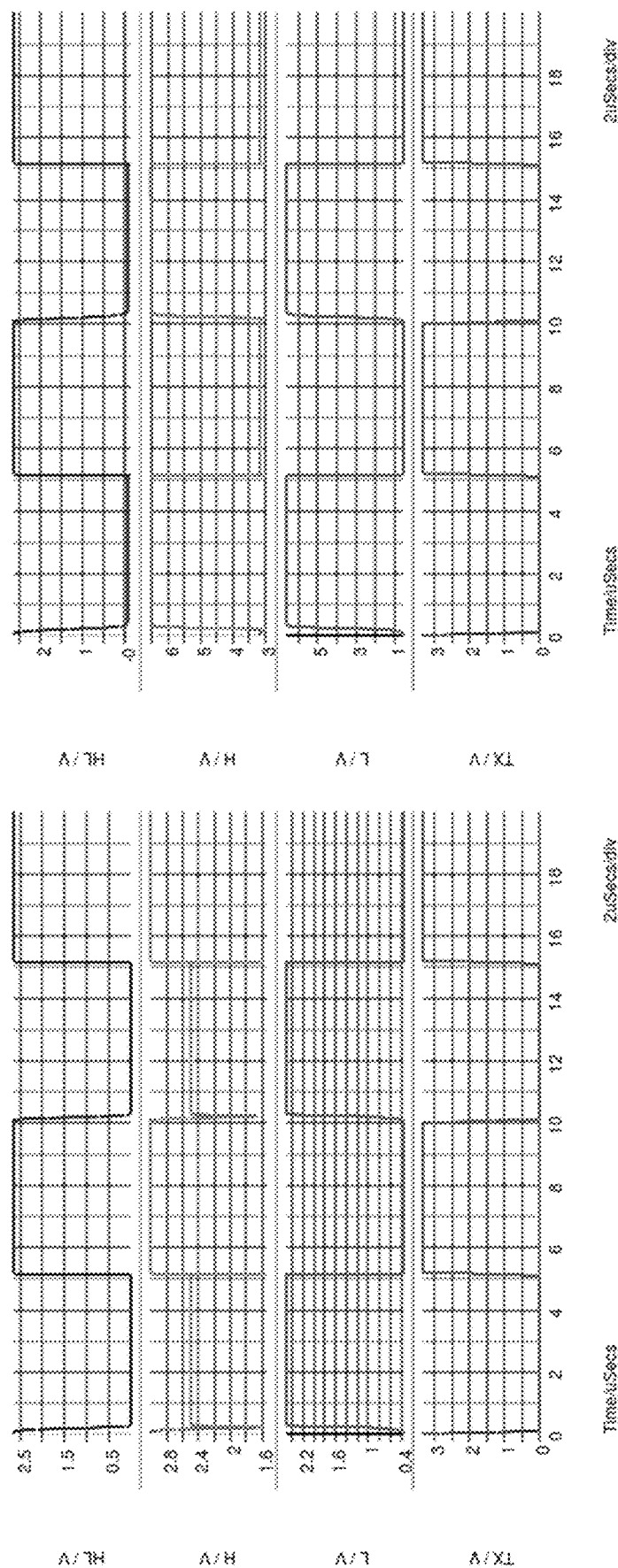
FIG. 18 illustrates simulation results for a driver circuit for a communication bus according to embodiments of the disclosure.

FIG. 18 illustrates simulation results for a driver circuit for a bi-directional differential communication bus according to embodiments of the disclosure. The left column of FIG. 18 relates to the case of an externally applied line voltage of 2.5V (compared to a supply voltage of 3.3V), and the right column relates to the case of an externally applied line voltage of 7.7V (compared to a supply voltage of 3.3V). Respective top panels illustrate the differential voltage between first and second output terminals. Respective second panels from the top illustrate the voltage level of the first output terminal (H line), and respective third panels from the top illustrate the voltage level of the second output terminal (L line). Respective bottom panels illustrate the voltage level of the control signal (TX). For both columns, the control signal alternates between ground and the supply voltage. In those periods in which the voltage level of the control signal is equal to the supply voltage, the pull-up driver circuit and the pull-down driver circuit of the driver circuit for the bi-directional differential communication bus are activated. The H line is pulled towards the supply voltage, and the L line is pulled towards ground in these periods. Accordingly, the voltage level of the H line (first output terminal) is close to the supply voltage, and the voltage level of the L line (second output terminal) is close to ground. Further, the voltage level of the first and second output terminals equals the externally applied line voltage for periods in which the voltage level of the control signal is equal to ground. As can be seen from this figure, the driver circuit operates correctly and supplies a differential voltage conforming to e.g. the CAN standard even for externally applied voltages in excess of the supply voltage. It has been found that the driver circuit operates correctly for externally applied line voltages up to 16V without breakdown.

It should be noted that the apparatus features described above correspond to respective method features that are however not explicitly described, for reasons of conciseness, and vice versa. The disclosure of the present document is considered to extend also to such method features, and vice versa.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed apparatus. Furthermore, all statements herein providing principles, aspects, and embodiments of the invention, as well as specific examples thereof, are intended to encompass equivalents thereof.

The invention claimed is:

1. A bi-state driver circuit for switching an output terminal between a first predetermined voltage level and a high impedance state, comprising:
   a first string of transistors connected between the output terminal and the first predetermined voltage level and comprising at least a first transistor arranged closer to the first predetermined voltage level and a second transistor arranged closer to the output terminal;
   a voltage divider circuit connected between the output terminal and a voltage level of a control signal attaining voltage levels between the first predetermined voltage level and a second predetermined voltage level, comprising at least one intermediate node having an intermediate voltage level between a voltage level of the output terminal and the voltage level of the control signal; and
   a second string of transistors connected between the intermediate node of the voltage divider circuit and the second predetermined voltage level, and comprising at least a third transistor;
   wherein a control terminal of the second transistor is connected to the intermediate node;
   the first transistor is configured to be switched in accordance with the control signal; and
   the third transistor is configured to be switched in accordance with the control signal, in a phase-locked relationship with the first transistor.

2. The bi-state driver circuit according to claim 1,
   wherein the second string further comprises a fourth transistor connected between the third transistor and the intermediate node of the voltage divider circuit:
   the bi-state driver circuit further comprises a fifth transistor connected between the first predetermined voltage level and a control terminal of the fourth transistor; and
   the fifth transistor is configured to be switched in accordance with the control signal, in a phase-locked relationship with the first transistor.

3. The bi-state driver circuit according to claim 2, further comprising a sixth transistor connected between the fifth transistor and the control terminal of the fourth transistor,
   wherein a control terminal of the sixth transistor is connected to the intermediate node.

4. The bi-state driver circuit according to claim 1,
   wherein the first string of transistors comprises N transistors, N≥2;
   the voltage divider circuit comprises N−1 intermediate nodes having intermediate voltage levels between the voltage level of the output terminal and a voltage level of a control signal attaining voltage levels between the first predetermined voltage level and a second predetermined voltage level;
   control terminals of N−1 transistors of the N transistors in the first string that are arranged closest to the output terminal are connected, in the order of their arrangement in the first string from the output terminal to the first predetermined voltage level, to respective intermediate nodes of the voltage divider circuit, in the order of their intermediate voltage levels, from the voltage level of the output terminal to the voltage level of the control signal;
   the bi-state driver circuit comprises N−1 second strings of transistors;
   each m-th second string among the N−1 second strings, 1≤m≤N−1, comprises m transistors and is connected between the second predetermined voltage level and that intermediate node to which the control terminal of the (m±1)-th transistor among the N transistors in the first string, counting from the first predetermined voltage level, is connected;
   a transistor among the N transistors in the first string that is arranged closest to the first predetermined voltage level is configured to be switched in accordance with the control signal; and
   in each of the N−1 second strings, a transistor that is arranged closest to the second predetermined voltage level is configured to be switched in accordance with the control signal, in a phase-locked relationship with said transistor among the N transistors in the first string that is arranged closest to the first predetermined voltage level.

5. The bi-state driver circuit according to claim 4,
   wherein N≥3;
   the bi-state driver circuit further comprises N−2 third strings of transistors;
   each n-th third string, 1≤n≤N−2, comprises n transistors and is connected between the first predetermined voltage level and respective control terminals of an (n+1)-th transistor, counting from the second predetermined voltage level, of each of the (n±1)-th to (N−1)-th second strings; and
   in each third string, a transistor arranged closest to the first predetermined voltage level is configured to be switched in accordance with the control signal, in a phase-locked relationship with said transistor among the N transistors in the first string that is arranged closest to the first predetermined voltage level.

6. The bi-state driver circuit according to claim 5,
   wherein for each n-th third string, control terminals of the n−1 transistors different from said transistor arranged closest to the first predetermined voltage level are connected to respective intermediate nodes of the voltage divider circuit; and/or
   wherein for each n-th third string, the control terminals of the second to n-th transistors, counting from the first predetermined voltage level, are respectively connected to those intermediate nodes of the voltage divider circuit to which the second to n-th transistors among the N transistors in the first string, counting from the first predetermined voltage level, are connected.

7. The bi-state driver circuit according to claim 5,
   wherein each n-th third string comprises n+1 transistors; and
   for each n-th third string, a control terminal of the (n+1)-th transistor, counting from the first predetermined voltage level, is connected to that intermediate node of the voltage divider circuit to which the control terminal of the (n+1)-th transistor among the N transistors in the first string, counting from the first predetermined voltage level, is connected.

8. The bi-state driver circuit according to claim 4,
   wherein each m-th second string comprises m+1 transistors;
   for each p-th second string, 1≤p≤N−2, a control terminal of the (p+1)-th transistor, counting from the second predetermined voltage level, is connected to the control terminal of the (p+1)-th transistor of the (p+1)-th second string, counting from the second predetermined voltage level;
   the bi-state driver circuit further comprises an additional third string of transistors comprising N−1 transistors and being connected between the first predetermined voltage level and a control terminal of the N-th transistor of the (N−1)-th second string, counting from the second predetermined voltage level; and a transistor of the additional third string arranged closest to the first predetermined voltage level is configured to be switched in accordance with the control signal, in a phase-locked relationship with said transistor of the first string arranged closest to the first predetermined voltage level.

9. The bi-state driver circuit according to claim 8,
wherein the additional third string comprises N transistors; and
control terminals of the first to N-th transistors of the additional third string, counting from the first predetermined voltage level, are respectively connected to those intermediate nodes of the voltage divider circuit to which the first to N-th transistors among the N transistors in the first string, counting from the first predetermined voltage level, are connected.

10. The bi-state driver circuit according to claim 1,
wherein the voltage divider circuit comprises a string of resistors; and
the intermediate nodes are arranged between adjacent resistors.

11. The bi-state driver circuit according to claim 1,
wherein the voltage divider circuit comprises a main string of resistors connected between the output terminal and the voltage level of the control signal;
a first group of intermediate nodes is formed by intermediate nodes respectively arranged between adjacent resistors of the main string of resistors;
the control terminals of the transistors of the first string of transistors are connected to respective intermediate nodes in the first group;
the voltage divider circuit further comprises one or more secondary strings of resistors, each secondary string of resistors being connected between one of the intermediate nodes of the first group and the voltage level of the control signal;
a second group of intermediate nodes is formed by intermediate nodes respectively arranged between adjacent resistors of the one or more secondary strings of resistors; and
the control terminal of at least one of the transistors of one of the third strings is connected to an intermediate node in the second group.

12. The hi-state driver circuit according to claim 1,
wherein for at least one of the transistors among the N transistors in the first string of transistors, a series-connected transistor is provided;
the respective transistor and the series-connected transistor are connected in series;
a control terminal of the series-connected transistor is connected to the control terminal of the respective transistor; and
bulk terminals of the respective transistor and the series connected transistor are connected to an intermediate node arranged between the respective transistor and the series-connected transistor.

13. A driver circuit for switching a first output terminal between a first output voltage level and a high impedance state, and for switching a second output terminal between a second output voltage level and the high impedance state, comprising:
a first bi-state driver circuit according to claim 1 configured to switch the first output terminal between said first output voltage level and said high impedance state; and
a second bi-state driver circuit according to claim 1 configured to switch the second output terminal between said second output voltage level and said high impedance state, connected in reverse between the first and second output voltage levels compared to the first bi-state driver circuit.

14. A driver circuit for switching a first output terminal between a first output voltage level and a high impedance state, and for switching a second output terminal between a second output voltage level and the high impedance state, comprising:
a first bi-state driver circuit according to claim 5 configured to switch the first output terminal between said first output voltage level and said high impedance state; and
a second bi-state driver circuit according to claim 5 configured to switch the second output terminal between said second output voltage level and said high impedance state, connected in reverse between the first and second output voltage levels compared to the first bi-state driver circuit,
wherein at least one transistor is shared between the first bi-state driver circuit and the second bi-state driver circuit.

15. A method of controlling a bi-state driver circuit for switching an output terminal between a first predetermined voltage level and high impedance state,
wherein the bi-state driver circuit comprises:
a first string of transistors connected between the output terminal and the first predetermined voltage level and comprising at least a first transistor arranged closer to the first predetermined voltage level and a second transistor arranged closer to the output terminal;
a voltage divider circuit connected between the output terminal and a voltage level of a control signal, comprising at least one intermediate node having an intermediate voltage level between a voltage level of the output terminal and the first predetermined voltage level, wherein the intermediate node is connected to a control terminal of the second transistor; and
a second string of transistors connected between the intermediate node of the voltage divider circuit and a second predetermined voltage level, and comprising at least a third transistor; and
the method comprises:
generating the control signal attaining voltage levels between the first predetermined voltage level and the second predetermined voltage level;
switching the first transistor in accordance with the control signal; and
switching the third transistor in accordance with the control signal, in a phase-locked relationship with the first transistor.

* * * * *